(12) United States Patent
Kawakatsu et al.

(10) Patent No.: US 6,611,178 B1
(45) Date of Patent: Aug. 26, 2003

(54) NANOMETER-ORDER MECHANICAL VIBRATOR, PRODUCTION METHOD THEREOF AND MEASURING DEVICE USING IT

(75) Inventors: Hideki Kawakatsu, Tokyo (JP); Hiroshi Toshiyoshi, Kanagawa (JP)

(73) Assignee: Japan Science and Technology Corporation (JP)

( * ) Notice: Subject to any disclaimer, the term of this patent is extended or adjusted under 35 U.S.C. 154(b) by 5 days.

(21) Appl. No.: 10/009,560

(22) PCT Filed: Jul. 11, 2000

(86) PCT No.: PCT/JP00/04622

§ 371 (c)(1),
(2), (4) Date: Dec. 14, 2001

(87) PCT Pub. No.: WO01/05701

PCT Pub. Date: Jan. 25, 2001

(30) Foreign Application Priority Data

Jul. 16, 1999 (JP) .............................. 11-202682
May 26, 2000 (JP) ........................ 2000-156645

(51) Int. Cl.[7] .............. B81B 3/00; B81C 1/00; G01P 15/00; G11B 9/14; H01L 29/84
(52) U.S. Cl. ................ 331/154; 310/311; 73/862; 73/862.046; 73/862.324; 73/862.325; 73/862.336; 73/862.41; 73/862.451; 331/65
(58) Field of Search ................ 331/154, 65; 310/311; 73/862, 862.046, 862.324, 862.325, 862.336, 862.41, 862.451

(56) References Cited

U.S. PATENT DOCUMENTS 6,441,371 B1 * 8/2002 Ahn et al. ................. 250/306

FOREIGN PATENT DOCUMENTS

| JP | 5-189047 | 7/1993 |
| JP | 10-247118 | 9/1998 |
| JP | 10-300762 | 11/1998 |
| JP | 11-201848 | 7/1999 |

* cited by examiner

*Primary Examiner*—David C. Mis
(74) *Attorney, Agent, or Firm*—Lorusso, Loud & Kelly

(57) ABSTRACT

There are provided a stable and highly sensitive nanometric mechanical oscillator having a considerably high detection resolution that enables detection of variation in force or mass on the nanometer order, as well as a method of fabricating the same, and a measurement apparatus using the same.

A nanometric mechanical oscillator (10) includes a base (11), a tetrahedral oscillator mass (13); and an elastic neck portion (12) for connecting the base (11) and the tetrahedral oscillator mass (13). The oscillator (10) assumes a mushroom-like shape and has a nanometric size. The oscillator mass (13) assumes a tetrahedral shape and is suitable to be used as a probe of a scanning forth microscope in which the oscillator mass (13) serving as a probe is caused to approach to an arbitrary sample surface in order to observe the surface state.

35 Claims, 35 Drawing Sheets

Fig. 18
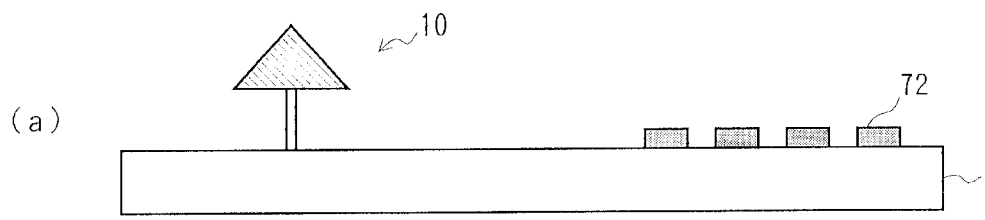
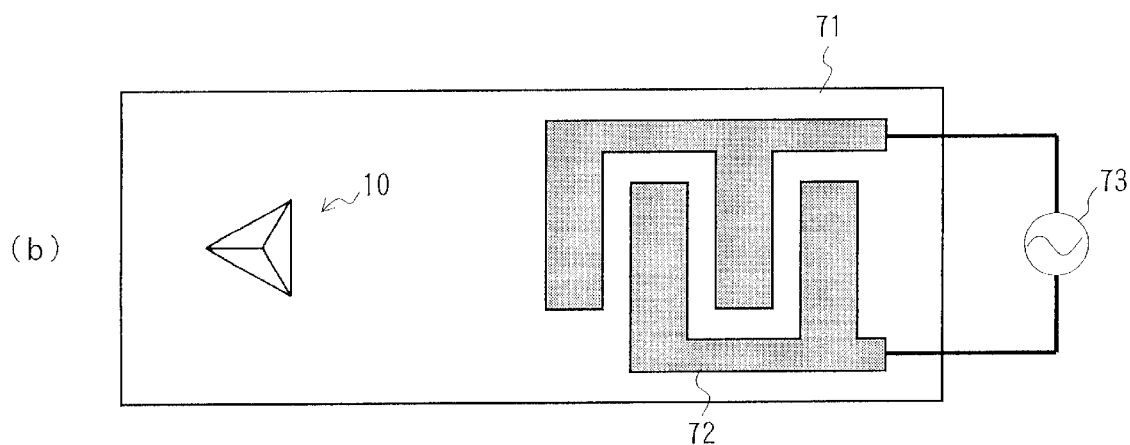
Fig. 19
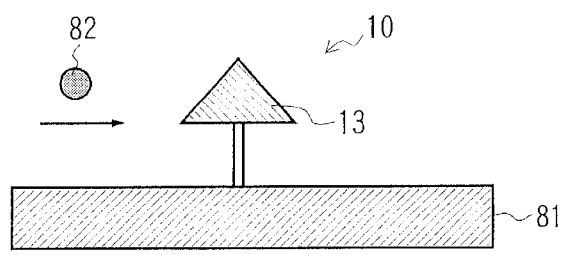

Fig. 33
(a)
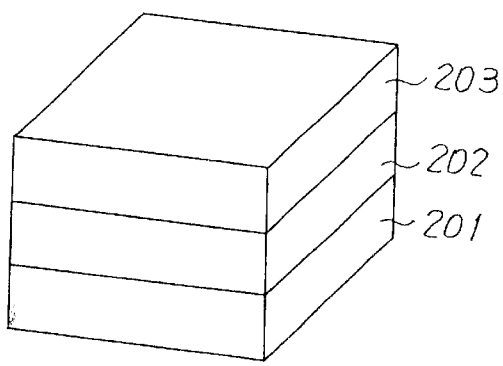
(b)
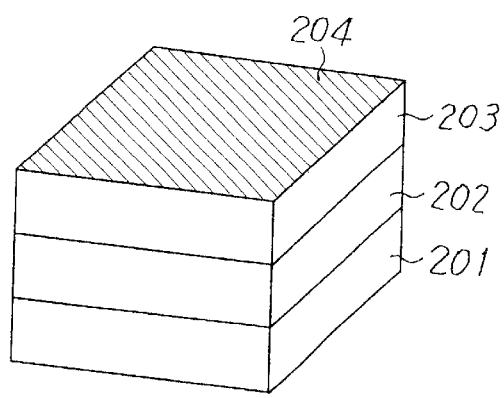
(c)
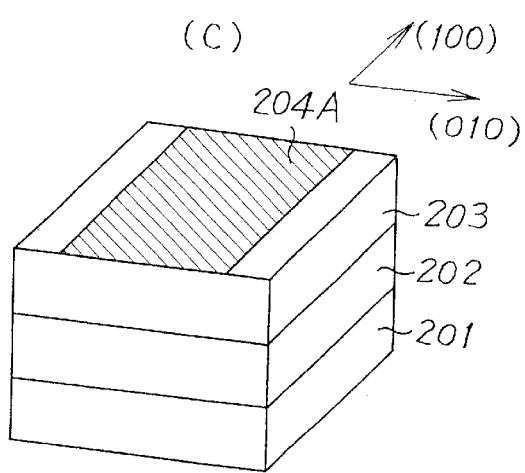
(d)
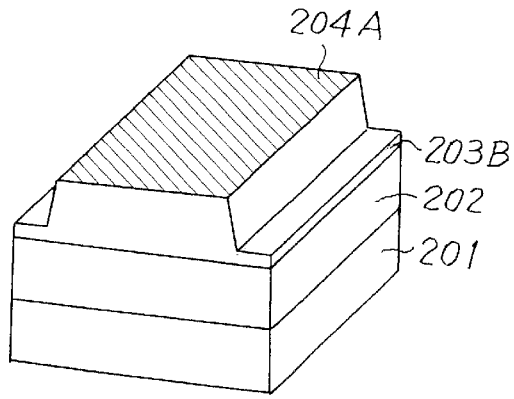

Fig. 38
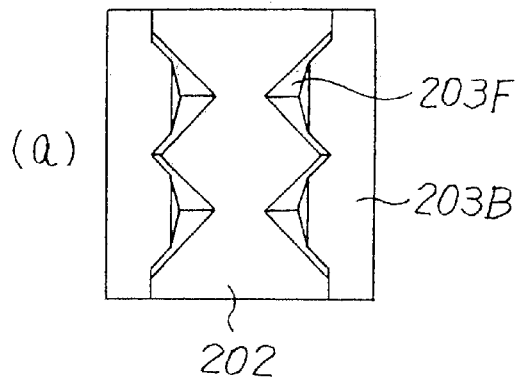
(a)
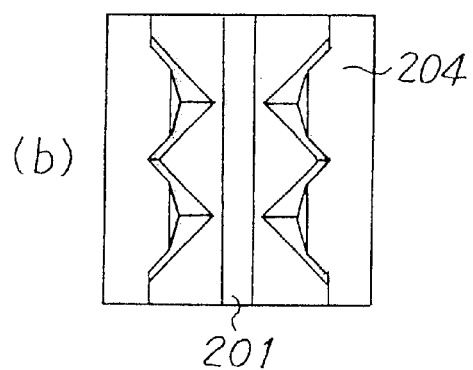
(b)
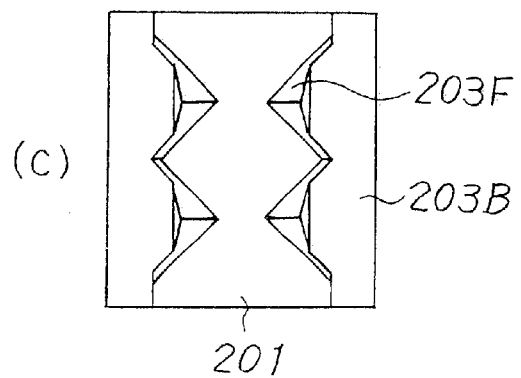
(c)

Fig. 42
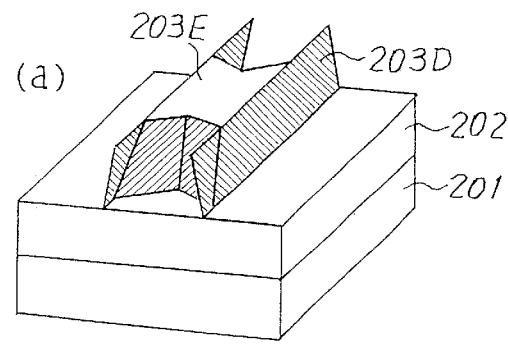
(a)
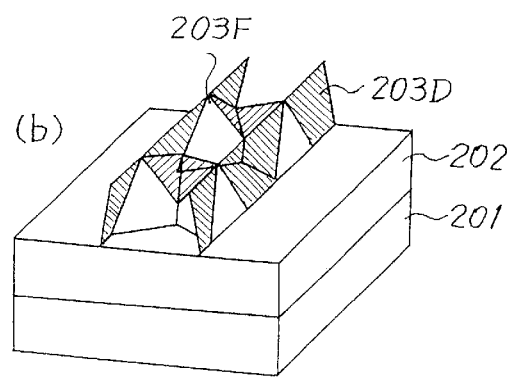
(b)
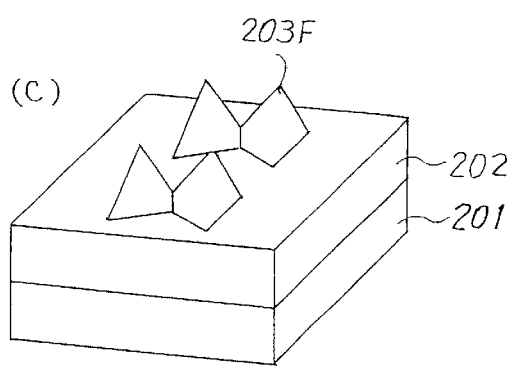
(c)
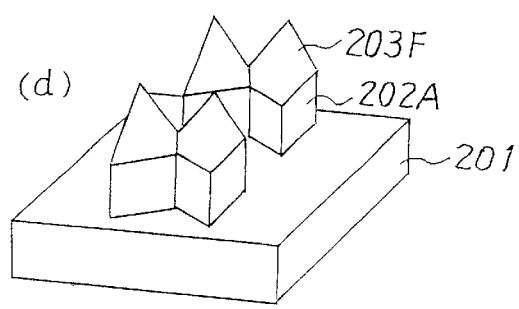
(d)

Fig. 43
(a) 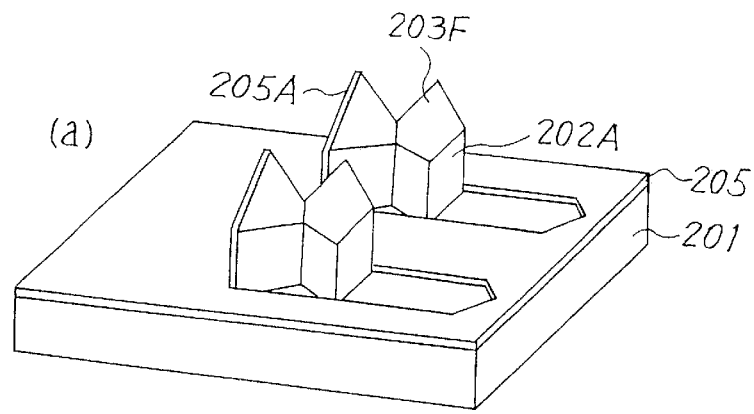
(b) 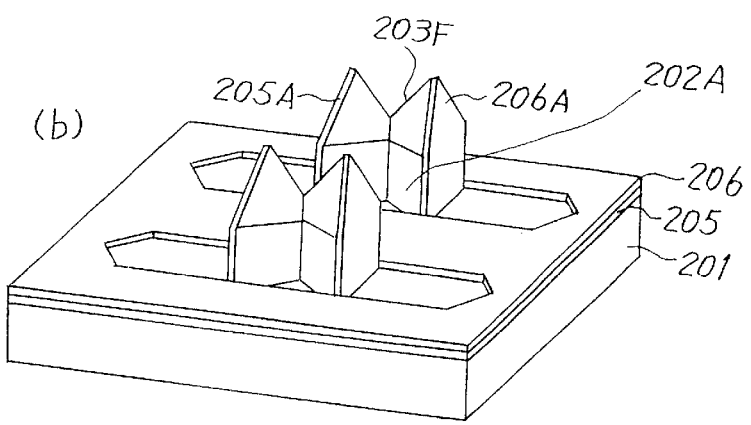
(c) 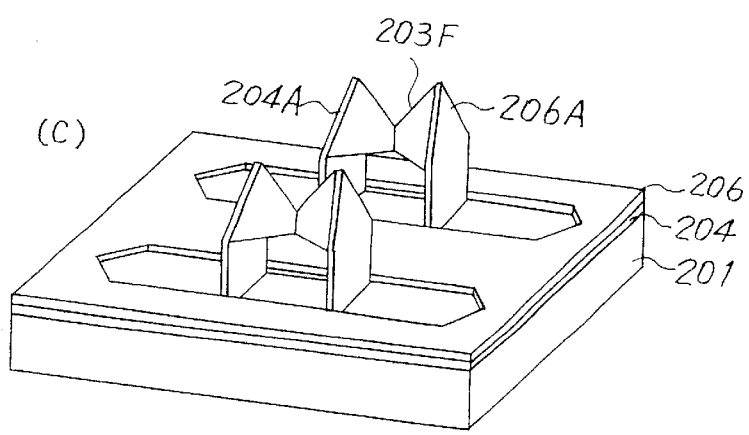

NANOMETER-ORDER MECHANICAL VIBRATOR, PRODUCTION METHOD THEREOF AND MEASURING DEVICE USING IT

CROSS-REFERENCE TO RELATED APPLICATIONS

This application is a National Phase Application (35 USC 371) of PCT/JP00/04622 filed Jul. 11, 2000 and claims priority of Japanese Application No. 11-202682 filed Jul. 16, 1999 and Japanese Application No. 2000-156645 filed May 26, 2000.

TECHNICAL FIELD

The present invention relates to a nanometric mechanical oscillator, a method of fabricating the same, and a measurement apparatus using the same.

BACKGROUND ART

Conventionally, the following techniques have been known in the field of interest.

(1) G. Binnig, C. Gerber, and C. F. Quate: Phys. Rev. Lett. 56 (1986) 930.

(2) T. D. Stowe, K. Yasumura, T. W. Kenny, D. Botkin, K. Wago, and D. Rugar: Appl. Phys. Lett. 71 (1997) 288.

(3) D. A. Walters, J. P. Cleveland, N. H. Thomson, P. K. Hansma, M. A. Wendman, G. Gurley, and V. Elings: Rev. Sci. Instrum. 67 (1996) 3583.

(4) Vu. Thien Binh, N. Garcia, and A. L. Levanuyk: Surf. Sci. Lett. 301 (1994) L224.

The scanning force microscope was invented by Gerd Binnig, et al. around 1986 (above-mentioned literature 1). Subsequently, in the mid to late 1980s, T. Albrecht, Calvin Quate, et al. developed a strip-shaped cantilever having a length of a few hundreds of microns and having at its tip a probe having a height of about 3 $\mu$m. The cantilever was fabricated from silicon or silicon nitride. Since the mid to late 1980s, cantilevers of the above-described configuration have been sold in the market.

In order to measure weak force, Dan Rugar, et al. attempted to use a very thin and long cantilever (above-mentioned literature 2). Further, in order to increase the characteristic frequency of a cantilever and shorten observation time, Paul Hansma, et al. proposed a cantilever having a length of 1 $\mu$m to 10 $\mu$m, which is shorter than conventional cantilevers having a length on the order of 100 $\mu$m (above-mentioned literature 3). Notably, the latter two cantilevers are both strip-shaped and are improved versions of the cantilever developed in the 1980s.

Meanwhile, in relation to nanometric mechanical oscillators, Vu. Thien Binh, N. Garcia, et al. demonstrated that a kokeshi-doll-shape oscillator could be fabricated through a process of heating a sharp metal probe in vacuum (above-mentioned literature 4).

Measurement of variations in the amplitude of vibration and characteristic frequency of a mechanical oscillator enables detection of variation in the mass of the oscillator and variation of a field in which the oscillator is placed.

DISCLOSURE OF THE INVENTION

The force detection resolution obtained by use of a mechanical oscillator increases when its characteristic frequency or quality factor increases and when its spring constant or temperature is lowered. When a mechanical oscillator can be modeled as a spring/mass system, reducing the size of the oscillator advantageously increases sensitivity.

This is because, through reduction in the mass of the mechanical oscillator, the characteristic frequency can be increased while the spring constant is maintained unchanged.

In view of the foregoing, an object of the present invention is to provide a stable and highly sensitive nanometric mechanical oscillator having a considerably high detection resolution that enables detection of variation in force or mass on the nanometer order, as well as a method of fabricating the same, and a measurement apparatus using the same.

In order to achieve the above object, the present invention provides the following.

[1] A nanometric mechanical oscillator comprising a base; a rectangular oscillator mass; and an elastic neck portion for connecting the base and the rectangular oscillator mass, the neck portion having a rectangular cross section when cut along a plane perpendicularly intersecting a main axis thereof.

[2] A method of fabricating a nanometric mechanical oscillator, comprising preparing a substrate composed of a silicon substrate, a first silicon oxide film, a silicon film, and a second silicon oxide film; forming a metal film on the second silicon oxide film; forming a rectangular mask on the metal film; etching the metal film by use of a solution and the mask; and etching vertically and successively the second silicon oxide film, the silicon film, the first silicon oxide film, and the silicon substrate through reactive ion etching, whereby a neck portion having a rectangular cross section when cut along a plane perpendicularly intersecting a main axis thereof is formed through the etching of the first silicon oxide film.

[3] A measurement apparatus comprising a nanometric mechanical oscillator including a base, an oscillator mass, and an elastic neck portion for connecting the base and the oscillator mass; a thin-film-shaped sample formed on the oscillator mass; and a stationary probe for observing the thin-film-shaped sample.

[4] A nanometric mechanical oscillator comprising a base; a tetrahedral oscillator mass; and an elastic neck portion for connecting the base and the tetrahedral oscillator mass.

[5] A method of fabricating a nanometric mechanical oscillator, comprising preparing a substrate composed of a silicon substrate, a silicon oxide film, and a silicon film; forming a tetrahedral oscillator mass on the silicon oxide film through anisotropic etching of the silicon film; etching vertically the silicon oxide film through reactive ion etching, while using the tetrahedral oscillator mass as a mask, whereby a neck portion having elasticity is formed through the etching of the silicon oxide film.

[6] A measurement apparatus comprising a nanometric mechanical oscillator including a base, a tetrahedral oscillator mass, and an elastic neck portion for connecting the base and the tetrahedral oscillator mass, wherein the tetrahedral oscillator mass is oscillated vertically relative to a surface of a sample so as to observe the surface state of the sample.

[7] A measurement apparatus comprising a nanometric mechanical oscillator including a base, a tetrahedral oscillator mass, and an elastic neck portion for connecting the base and the tetrahedral oscillator mass, wherein the tetrahedral oscillator mass is oscillated horizontally relative to a surface of a sample so as to observe the surface state of the sample.

[8] A measurement apparatus comprising a nanometric mechanical oscillator including a base, a tetrahedral oscillator mass, and an elastic neck portion for connecting the base and the tetrahedral oscillator mass, wherein the tetrahedral oscillator mass is disposed vertically in the vicinity of a surface of a right-angle prism; the surface totally reflects a laser beam entering the prism to thereby generate a photo nearfield in the vicinity of the surface; the nearfield is disturbed by oscillation of the oscillator; and generated propagating light is collected by a light receiving element in order to detect the amplitude and frequency of the oscillation of the oscillator.

[9] A measurement apparatus comprising a nanometric mechanical oscillator including a base, an oscillator mass, and an elastic neck portion for connecting the base and the oscillator mass, wherein a probe formed of a nano tube or whisker is fixed to the oscillator mass; and interaction between the probe and the sample is detected to thereby obtain an image.

[10] A measurement apparatus comprising a nanometric mechanical oscillator including a plurality of oscillator masses disposed on a base, and elastic neck portions for connecting the base and the respective oscillator masses, wherein a functional thin film is attached to each of the oscillator masses so as to detect a trace substance within a gas sample.

[11] A measurement apparatus comprising a nanometric mechanical oscillator having, on its base, an oscillator mass and an elastic neck portion for connecting the base and the oscillator mass, wherein a core of an optical fiber is fixed to the nanometric mechanical oscillator such that the oscillator faces a sample; and oscillation of the oscillator mass caused by the sample is detected optically.

[12] A measurement apparatus comprising a nanometric mechanical oscillator having, on its base, an oscillator mass and an elastic neck portion for connecting the base and the oscillator mass, wherein under vacuum, an electron beam from an electrode is radiated onto the oscillator, while being focused to have a focal point on the nanometer order; the base of the oscillator has electrical conductivity, and a portion of the oscillator exhibits a piezo effect; the oscillator causes self-excited oscillation due to current that flows upon irradiation with the electron beam and displacement of the oscillator caused by the current; and variation in current flowing out of the oscillator is detected by a high-frequency current detector to thereby detect the amplitude and frequency of the oscillation of the oscillator.

[13] A measurement apparatus comprising a nanometric mechanical oscillator having, on its base, an oscillator mass and an elastic neck portion for connecting the base and the oscillator mass, wherein through use of a solid immersion lens, a spot of light focused to a degree beyond a bendable limit is formed in the vicinity of the base of the nanometric mechanical oscillator; and the amplitude and frequency of oscillation of the oscillator are detected on the basis of return light.

[14] A measurement apparatus comprising a nanometric mechanical oscillator having, on its base, an oscillator mass and an elastic neck portion for connecting the base and the oscillator mass, wherein the oscillator is fixedly disposed on a layered substrate having a mask layer of Sb; a laser beam is radiated onto the mask layer so as to change a portion of the mask to thereby establish a state equal to formation of a nanometric opening; and thus oscillation of the oscillator only is detected.

[15] A measurement apparatus comprising a nanometric mechanical oscillator including a piezo substrate, an oscillator mass, and an elastic neck portion for connecting the substrate and the tetrahedral oscillator mass, wherein comb-shaped electrodes are disposed on the piezo substrate; and AC voltage is applied to the electrodes to thereby generate surface acoustic waves, which excite the oscillator to oscillate.

[16] A measurement apparatus comprising a nanometric mechanical oscillator having, on its base, a plurality of oscillator masses and elastic neck portions for connecting the base and the respective oscillator masses, wherein displacement of the oscillator masses which is caused upon collision of a particle with the oscillator in accordance with the law of conservation of momentum is measured so as to detect a velocity of the particle.

[17] A measurement apparatus comprising a nanometric mechanical oscillator including a base, an oscillator mass, and an elastic neck portion formed of a silicon whisker and for connecting the base and the oscillator mass, wherein the measurement apparatus measures acceleration or force.

[18] A method of fabricating a nanometric mechanical oscillator, comprising successively forming a silicon oxide film and a silicon film on a silicon substrate; anisotropically etching the silicon film to form a silicon tetrahedron; etching the silicon oxide film in a direction normal to the substrate while using the silicon tetrahedron as a mask to thereby form a silicon oxide column; vapor-depositing silicon or metal obliquely relative to the silicon substrate to thereby form a deposition film; and removing the silicon oxide column to thereby form an elastic neck portion for supporting a tetrahedral probe, the neck portion being the deposition film assuming a plate-like shape and made of silicon or metal.

[19] A method of fabricating a nanometric mechanical oscillator as described in [18], wherein the neck portion is composed of two deposition films each assuming a plate-like shape and made of silicon or metal.

[20] A nanometric mechanical oscillator including an element which comprises a first layer formed of a piezo substrate and having a surface-acoustic-wave generation unit; and a second layer having a large number of arrayed cantilevers each projecting from a base portion and having a probe, wherein the first and second layers are superposed on each other; and surface acoustic waves are generated within the piezo substrate along two directions in a plane, such that the respective probes sequentially approach a measurable region of a sample.

[21] A measurement apparatus comprising a large number of nanometric cantilevers arranged in a matrix on a substrate having an oscillating unit; a sample table on which a sample is placed to face the cantilevers; a lens system disposed on the back side of the cantilevers; an optical system for radiating light onto the lens system via a half mirror; an image capturing unit disposed at the back of the half mirror; and a display unit connected to the image capturing unit, whereby an image of the sample is displayed through action of the cantilevers.

[22] A nanometric mechanical oscillator, wherein surface-acoustic-wave generation units are disposed along four sides of a piezo substrate; and a large number of cantilevers are arranged in a matrix at a center portion thereof.

[23] A nanometric mechanical oscillator comprising: a nanometric cantilever disposed on a substrate having an actuator; and means for changing the length of the cantilever.

[24] A nanometric mechanical oscillator as described in [23], wherein the actuator is a surface-acoustic-wave generation unit.

[25] A nanometric mechanical oscillator comprising a cantilever which projects from a base, is mainly formed of a plastic containing magnetic powder, and is magnetized in a direction intersecting an axial direction of the cantilever.

[26] A nanometric mechanical oscillator comprising a cantilever which projects from a base and is mainly formed of a plastic containing whisker crystals arranged along an axial direction of the cantilever.

[27] A nanometric mechanical oscillator comprising: a cantilever which projects from a base; and a surface-acoustic-wave generation unit provided on the base in the vicinity of a root portion of the cantilever.

[28] A nanometric mechanical oscillator comprising: a cantilever which projects from a base; a surface-acoustic-wave generation unit provided on the base in the vicinity of a root portion of the cantilever; and means for changing the length of the cantilever.

[29] A nanometric mechanical oscillator comprising a triangular-pyramidal probe formed on an insulating film on a semiconductor substrate such that the probe projects outward in an overhung state.

[30] A nanometric mechanical oscillator as described in [29], wherein a single or a large number of triangular-pyramidal probes are formed at the tip of a semiconductor chip.

[31] A nanometric mechanical oscillator as described in [27], wherein the cantilever has a triangular-pyramidal probe that projects outward.

[32] A nanometric mechanical oscillator as described in [27], wherein a large number of triangular-pyramidal probes are formed at the tip of a semiconductor chip.

[33] A nanometric mechanical oscillator comprising a parallel-spring supported portion including two triangular-pyramidal probes which are formed on a semiconductor substrate such that the probes project inward in an overhung state and are connected to each other.

[34] A nanometric mechanical oscillator comprising a parallel-spring supported portion including a probe assuming the form of a triangular prism projecting from a semiconductor substrate.

[35] A nanometric mechanical oscillator comprising a parallel-spring supported portion including a mass formed on a semiconductor substrate and assuming the shape of a truncated rectangular pyramid.

BRIEF DESCRIPTION OF THE DRAWINGS

FIG. 18 includes views showing a nanometric mechanical oscillator according to an eighth embodiment of the present invention.

FIG. 19 is a view showing a nanometric mechanical oscillator according to a ninth embodiment of the present invention.

FIG. 33 includes views showing steps of fabricating a nanometric mechanical oscillator according to an eighteenth embodiment of the present invention.

FIG. 38 includes top views showing the twelfth step of the fabrication process according to the eighteenth embodiment.

FIG. 42 includes views showing steps, subsequent to the steps shown in FIG. 41, of fabricating the parallel-spring-supported oscillator according to the twentieth embodiment of the present invention.

FIG. 43 includes views showing steps, subsequent to the steps shown in FIG. 42, of fabricating the parallel-spring-supported oscillator according to the twentieth embodiment of the present invention.

BEST MODE FOR CARRYING OUT THE INVENTION

Embodiments of the present invention will next be described in detail.

Figure 1:
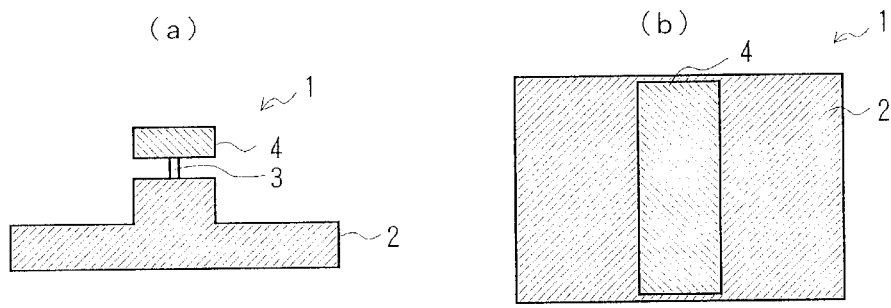
FIG. 1 includes views showing a nanometric mechanical oscillator according to a first embodiment of the present invention.
Figure 2:
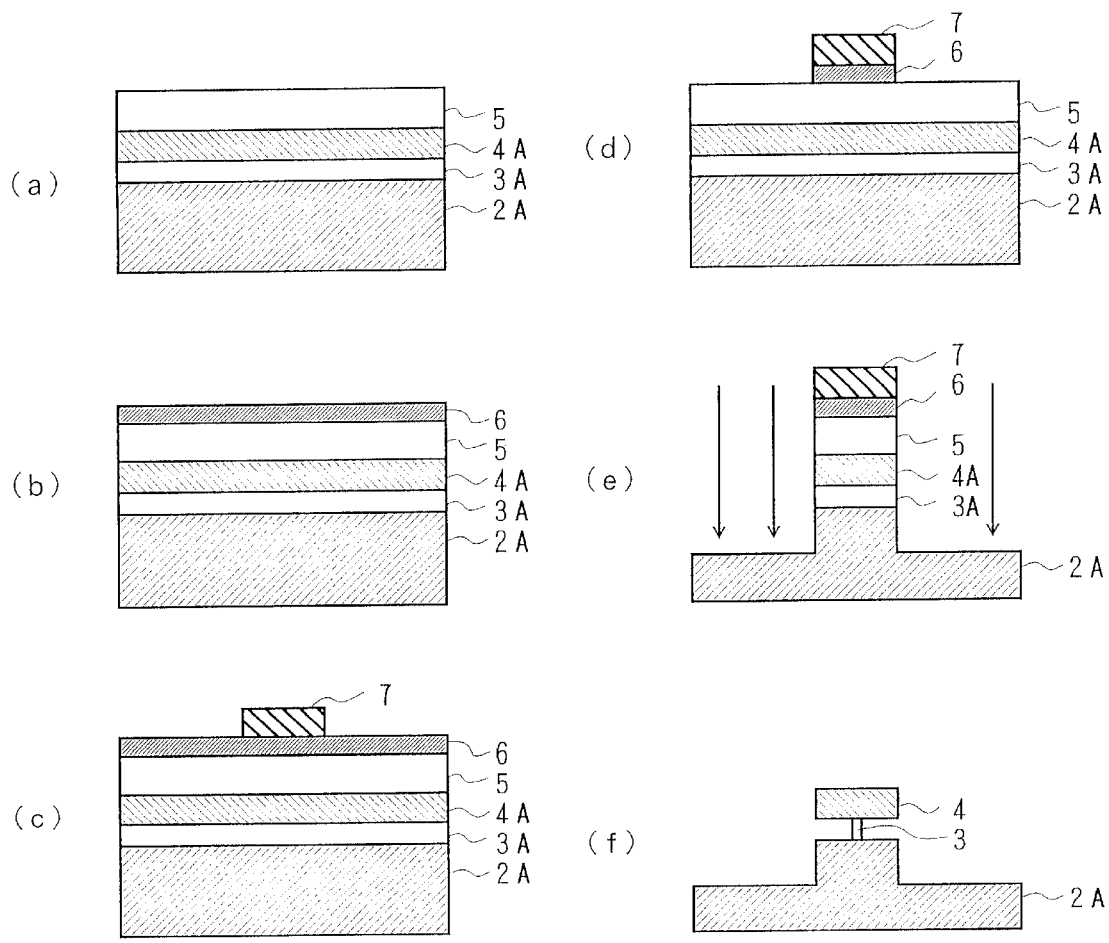
FIG. 2 includes cross-sectional views showing steps of fabricating the nanometric mechanical oscillator according to the first embodiment of the present invention.

FIG. 1 includes views showing a nanometric mechanical oscillator according to a first embodiment of the present invention. FIG. 2 includes cross-sectional views showing steps of fabricating the nanometric mechanical oscillator.

In FIG. 1, a rectangular nanometric mechanical oscillator 1 includes a base 2, a rectangular oscillator mass 4, and a neck portion 3 having elasticity and connecting the base 2 and the rectangular oscillator mass 4. The neck portion 3 has a rectangular cross section as viewed along a vertical direction.

The method of fabricating the nanometric mechanical oscillator will be described with reference to FIG. 2.

(1) First, as shown in FIG. 2(a), there is prepared a SIMOX (separation by implanted oxygen) substrate, which includes a silicon substrate 2A, a silicon oxide film (thickness: 100 nm) 3A, a silicon film (thickness: 60 nm) 4A, and a silicon oxide film 5.

(2) Subsequently, as shown in FIG. 2(b), a chromium (Cr) film 6 is formed on the silicon oxide film 5.

(3) Subsequently, as shown in FIG. 2(c), a rectangular mask 7 is formed. Specifically, resist is applied onto the chromium film 6, and is then subjected to patterning. For example, the resist (mask) 7 to be patterned has a diameter of 1 nm to 1 $\mu$m.

(4) Subsequently, as shown in FIG. 2(d), the chromium (Cr) film 6 is etched by use of aqueous solution of ammonium ceric nitrate.

(5) Subsequently, as shown in FIG. 2(e), through reactive ion etching, the silicon oxide film 5 is etched vertically by use of $CHF_3$, the silicon film (thickness: 60 nm) 4A is etched vertically by use of $SF_6$, the silicon oxide film (thickness: 100 nm) 3A is etched vertically by use of $CHF_3$, and the silicon substrate 2A is etched vertically by use of $SF_6$. Notably, in this step, the silicon substrate 2A becomes a base 2.

(6) Subsequently, as shown in FIG. 2(f), the silicon oxide film (thickness: 100 nm) 3A is etched by use of BHF (hydrofluoric acid) so as to form the neck portion 3, which has elasticity and a rectangular cross section when cut along a plane perpendicular to the main axis. The silicon oxide film 5, the chromium (Cr) film 6, and the resist (mask) 7 are lifted off.

In the above-described manner, the oscillator can be fabricated such that the rectangular oscillator mass 4 has a thickness of 60 nm and the neck portion 3 has a height of 100 nm. The diameter of the rectangular oscillator mass 4 is determined by the dimension of the mask 7, and the size of the neck portion 3 is determined by the time over which hydrofluoric acid etching is performed.

Presently, there is produced an oscillator whose rectangular oscillator mass 4 has a width of about 500 nm and whose neck portion 3 has a width of about 50 nm.

The nanometric mechanical oscillator fabricated as described above can be oscillated easily along an x-axis direction but cannot be oscillated easily along a y-axis direction. Therefore, when the mechanical oscillator is to be used as a sensor or actuator, detection and positioning by use of its anisotropy becomes possible.

Figure 3:
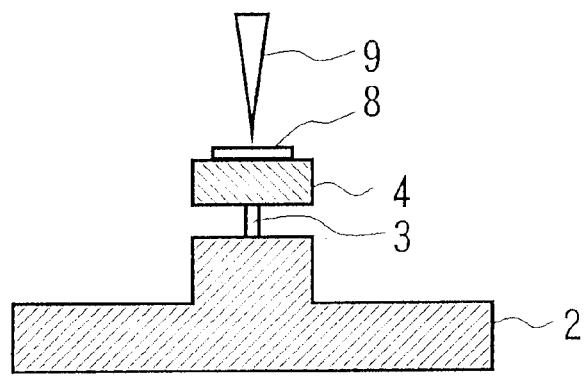
FIG. 3 is a view showing an example application of the nanometric mechanical oscillator according to the first embodiment of the present invention.

FIG. 3 shows a case in which the nanometric mechanical oscillator is applied to a scanning force microscope. In this case, a sample 8 assuming the form of a thin film is fabricated on the rectangular oscillator mass 4, which is an oscillator surface, and probing is performed by use of a stationary probe 9.

In addition to scanning force microscopes, an array-type rectangular mechanical oscillator 1 can be applied to a gas sensor of high sensitivity. In this case, each rectangular oscillator mass 4 is coated with an arbitrary functional thin film. When the thin film absorbs a specific substance, a resultant change in mechanical oscillation frequency can be detected.

Figure 4:
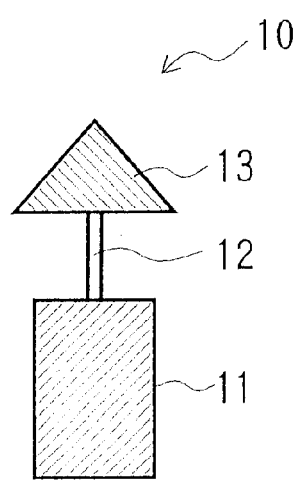
FIG. 4 is a view showing a nanometric mechanical oscillator according to a second embodiment of the present invention.
Figure 5:
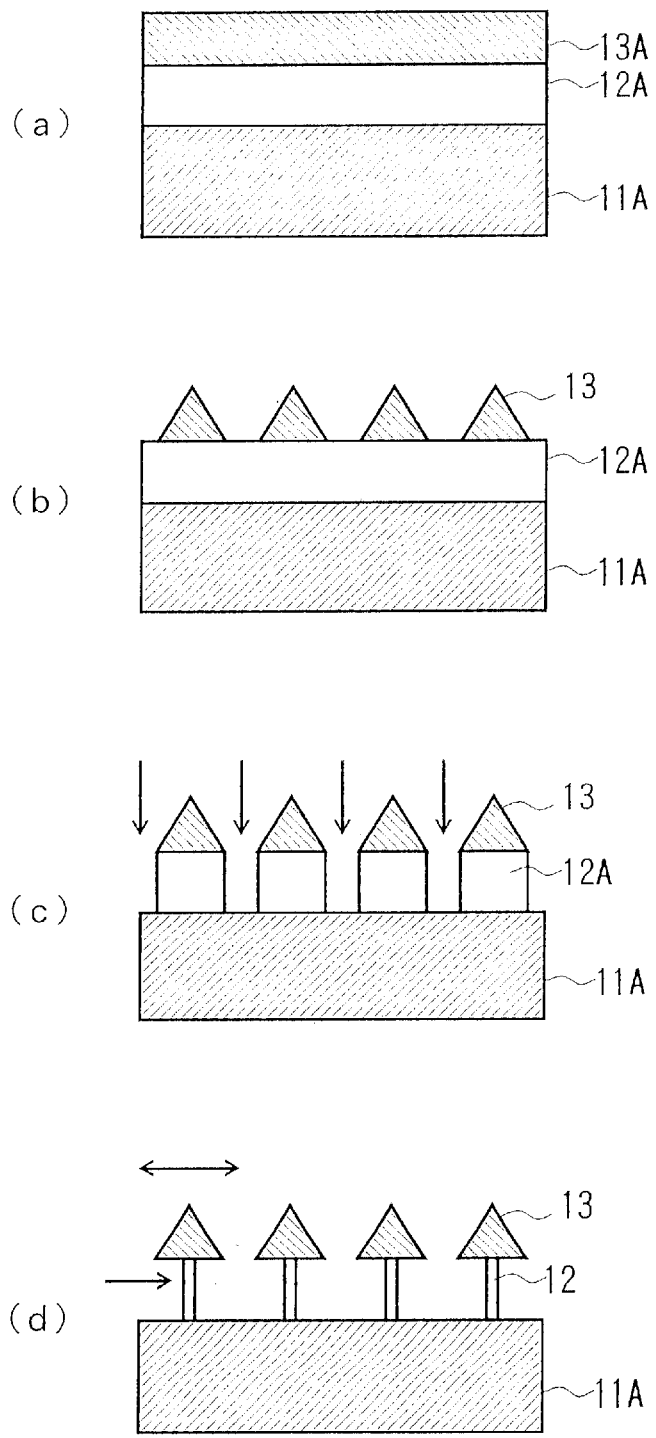
FIG. 5 includes cross-sectional views showing steps of a first method of fabricating the nanometric mechanical oscillator according to the second embodiment of the present invention.

FIG. 4 is a view showing a nanometric mechanical oscillator according to a second embodiment of the present invention. FIG. 5 includes cross-sectional views showing steps of a first method of fabricating the nanometric mechanical oscillator according to the second embodiment of the present invention.

As shown in FIG. 4, a nanometric mechanical oscillator 10 includes a base 11, a tetrahedral oscillator mass 13, and a neck portion 12, which connects the base 11 and the tetrahedral oscillator mass 13 and serves as an elastic portion.

The mechanical oscillator 10 assumes a mushroom-like shape and has a nanometric size. The oscillator mass 13 assumes a tetrahedral shape, and therefore is suitably used as a probe of a scanning force microscope in such a manner that the oscillator mass 13 is caused to approach an arbitrary sample surface to thereby observe the surface state.

The method of fabricating the nanometric mechanical oscillator according to the second embodiment will be described with reference to FIG. 5.

(1) First, as shown in FIG. 5(a), a bonded substrate is prepared. The bonded substrate includes a silicon substrate which is to serve as a base, a silicon film 13A, which is to serve as probes, and a silicon oxide film 12 formed between the silicon substrate 11A and the silicon film 13A as a film of a different material.

(2) Subsequently, as shown in FIG. 5(b), the silicon film 13A is subjected to anisotropic etching so as to form tetrahedral oscillator masses 13 on the silicon oxide film 12A.

(3) Subsequently, as shown in FIG. 5(c), the silicon oxide film 12A is etched vertically through reactive ion etching performed while the tetrahedral oscillator masses 13 are used as masks.

(4) Subsequently, as shown in FIG. 5(d), neck portions 12 are formed though, for example, wet etching of the silicon oxide film 12A by use of buffered hydrofluoric acid or vaporization removal of the silicon oxide layer upon application of heat. Notably, in this description, the wet etching and the vaporization removal of the silicon oxide layer upon application of heat are referred to as etching in a broad sense.

Use of this method enables fabrication of an oscillator utilizing etching anisotropy of crystal without being affected greatly by the performance of a lithography apparatus. The inventors have succeeded in fabrication of an oscillator by use of a bonded substrate composed of a silicon substrate and a silicon oxide film and fabrication of an oscillator by use of a SIMOX (separation by implanted oxygen) substrate. In the latter case, an oscillator was fabricated in such a manner that a probe of about 60 nm is supported by a neck portion of about 100 nm.

Figure 6:
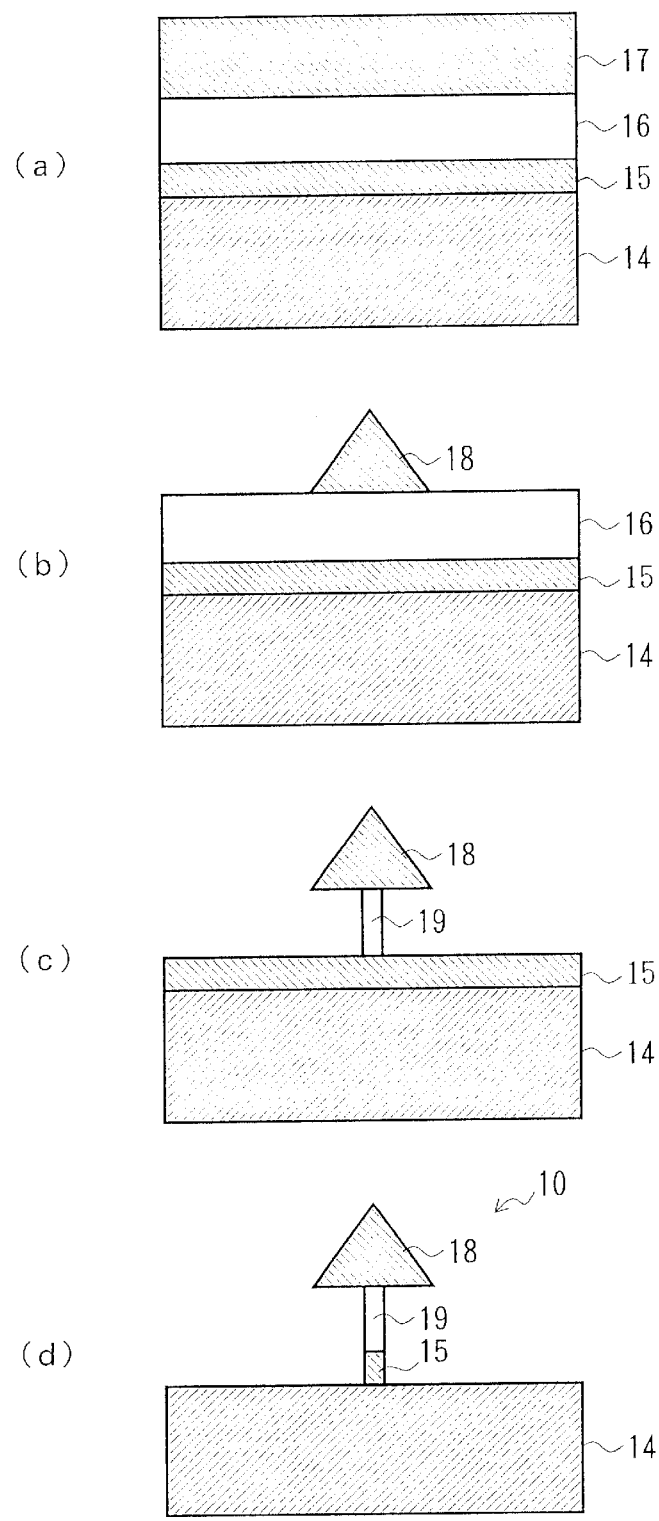
FIG. 6 includes cross-sectional views showing steps of a second method of fabricating the nanometric mechanical oscillator according to the second embodiment of the present invention.

FIG. 6 includes cross-sectional views showing steps of a second method of fabricating the nanometric mechanical oscillator according to the second embodiment of the present invention.

(1) First, as shown in FIG. 6(a), a bonded substrate is prepared. The bonded substrate includes a quartz substrate 14, which is to serve as a base, a silicon film 15, a silicon oxide film 16, which is to serve as a neck, and a silicon film 17, which is to serve as a probe.

(2) Subsequently, as shown in FIG. 6(b), the silicon film 17 is subjected to anisotropic etching so as to form a tetrahedral oscillator mass 18 on the silicon oxide film 16.

(3) Subsequently, as shown in FIGS. 6(c) and 6(d), the silicon oxide film 16 is etched vertically through reactive ion etching performed while the tetrahedral oscillator mass 18 is used as a mask. Subsequently, a neck portion 19 is formed though, for example, wet etching of the silicon oxide film by use of buffered hydrofluoric acid or vaporization removal of the silicon oxide layer upon application of heat.

As described above, this fabrication method is not limited to the case where a bonded substrate composed of a silicon substrate and a silicon oxide film is used. An oscillator-like structure having a head portion and a neck portion can be fabricated by use of a bonded substrate of a different type, provided that the substrate and film of the bonded substrate are formed of different materials and exhibit different properties in relation to processing such as etching or removal through application of heat. For example, when a bonded substrate composed of a quartz substrate and a silicon film or a bonded substrate composed of a quartz crystal substrate and a silicon film is used, introduction of light from the back face or excitation of an oscillator by use of the piezo effect of the base thereof becomes possible. A fabrication method similar to that shown in FIG. 5 can be used. However, in order to protect quartz (crystal substrate) from etching of silicon oxide by use of hydrofluoric acid, a silicon layer having a thickness of a few nm to a few tens of nm is provided.

The nanometric mechanical oscillator obtained in the above-described manner has the following possible applications.

Figure 7:
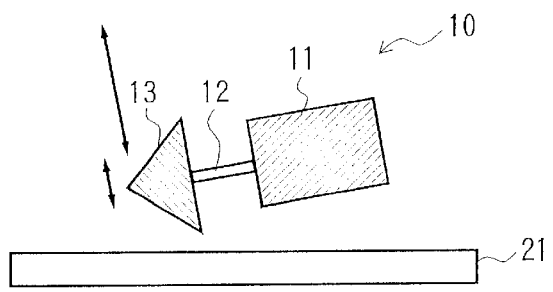
FIG. 7 is a view showing a first example application of the nanometric mechanical oscillator of the present invention.

(A) As shown in FIG. 7, the mechanical oscillator 10 is disposed to incline relative to a surface of a sample 21; and the oscillator mass 13 is oscillated along a direction perpendicular to the surface of the sample 21 so as to observe the surface state of the sample 21.

Figure 8:
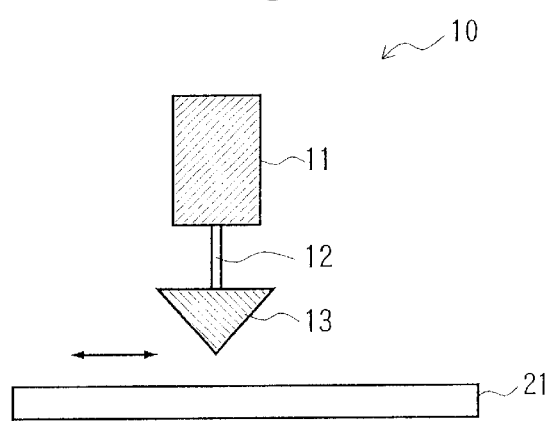
FIG. 8 is a view showing a second example application of the nanometric mechanical oscillator of the present invention.

(B) As shown in FIG. 8, the mechanical oscillator 10 is disposed to extend along a direction perpendicular to the surface of the sample 21; and the oscillator mass 13 is oscillated along a direction parallel to the surface of the sample 21 so as to observe the surface state of the sample 21.

Figure 9:
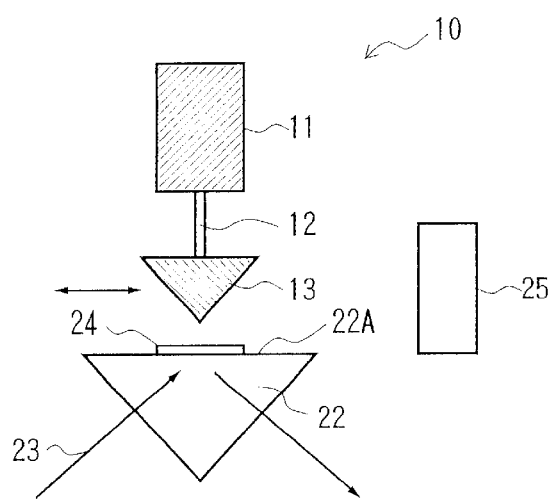
FIG. 9 is a view showing a third example application of the nanometric mechanical oscillator of the present invention.

(C) As shown in FIG. 9, a laser beam 23 entering a right-angle prism 22 is totally reflected by a surface 22A thereof, so that a photo field (nearfield) is generated at the prism surface 22A. A sample 24 is placed on the prism surface 22A. The nanometric mechanical oscillator 10 is fixedly disposed above the sample 24. The oscillator 10 emits light at its oscillation frequency and disturbs the nearfield, so that transmission light is produced. The light is collected and guided to a light receiving element 25 for detection of light. Thus, the amplitude and frequency of oscillation of the oscillator 10 can be detected.

Figure 10:
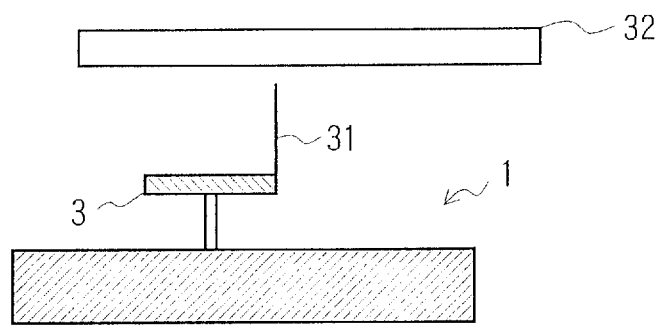
FIG. 10 is a view showing a fourth example application of the nanometric mechanical oscillator of the present invention.

(D) As shown in FIG. 10, a carbon nano tube (or whisker) 31 is fixed to the oscillator mass 3 of the nanometric mechanical oscillator 1 in such a manner that the carbon nano tube (or whisker) 31 extends upward from the oscillator mass 3, and the tip of the carbon nano tube (or whisker) 31 faces a surface of a sample 32 disposed above the oscillator 1.

Figure 11:
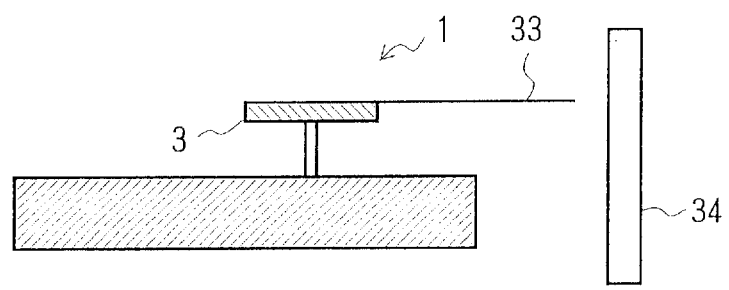
FIG. 11 is a view showing a fifth example application of the nanometric mechanical oscillator of the present invention.

(E) As shown in FIG. 11, a carbon nano tube (or whisker) 33 is fixed to the oscillator mass 3 of the nanometric mechanical oscillator 1 in such a manner that the carbon nano tube (or whisker) 33 extends horizontally from the oscillator mass 3, and the tip of the carbon nano tube (or whisker) 33 faces a surface of a sample 34 disposed on one side of the oscillator 1 with respect to the horizontal direction.

Figure 12:
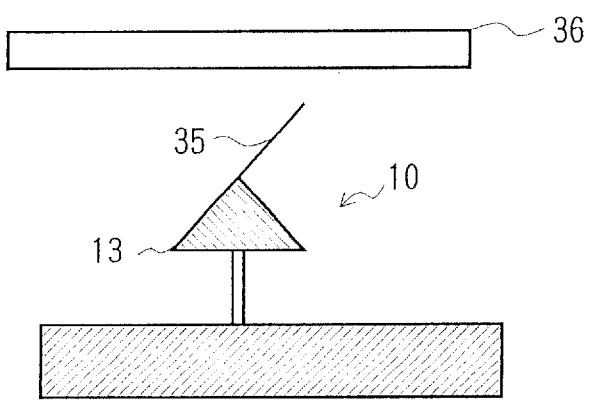
FIG. 12 is a view showing a sixth example application of the nanometric mechanical oscillator of the present invention.

(F) As shown in FIG. 12, a carbon nano tube (or whisker) 35 is fixed to the oscillator mass 13 of the nanometric mechanical oscillator 10 in such a manner that the carbon nano tube (or whisker) 35 extends upward from the oscillator mass 13, and the tip of the carbon nano tube (or whisker) 35 faces a surface of a sample 36 disposed above the oscillator 10.

There can be obtained a microscope in which a carbon nano tube or whisker is fixed to a nanometric mechanical oscillator as shown in any of FIGS. 10 to 12; the interaction between the carbon nano tube or whisker and a sample is detected by use of high sensitivity of the oscillator; and a corresponding image is obtained.

Figure 13:
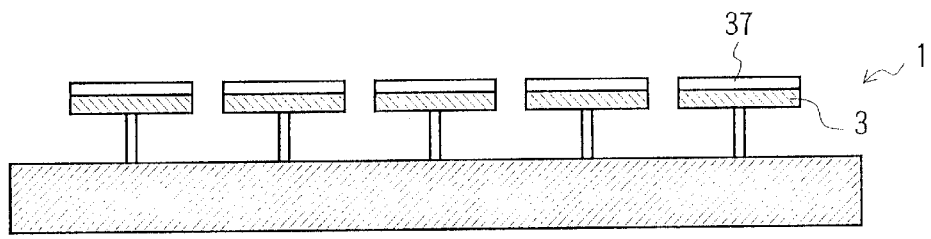
FIG. 13 is a view showing a nanometric mechanical oscillator according to a third embodiment of the present invention.

FIG. 13 is a view showing a nanometric mechanical oscillator according to a third embodiment of the present invention.

As shown in FIG. 13, an nanometric mechanical oscillator 1 has a large number of oscillator masses 3 arranged in a matrix pattern; and a functional thin film 37 capable of reacting with a specific substance or absorbing a specific substance is applied to each of the oscillator masses 3 by means of, for example, vapor deposition. The nanometric mechanical oscillator 1 can be used to obtain a measurement apparatus for detecting the presence and concentration of a trace substance in a gas sample.

Figure 14:
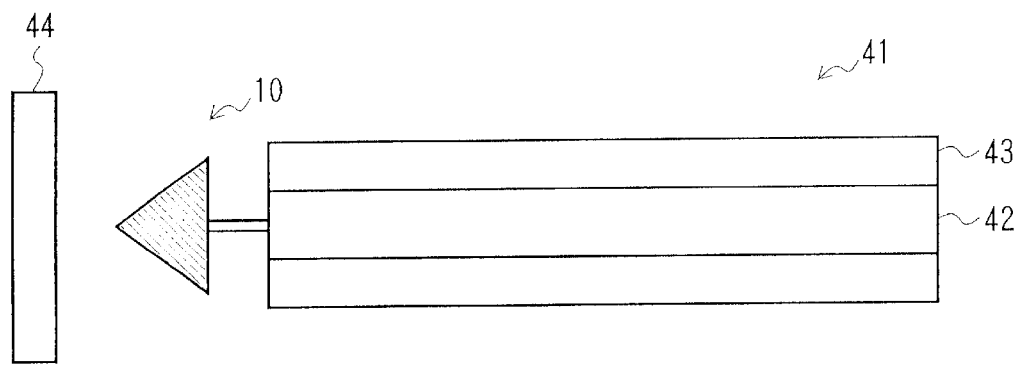
FIG. 14 is a view showing a nanometric mechanical oscillator according to a fourth embodiment of the present invention.

FIG. 14 is a view showing a nanometric mechanical oscillator according to a fourth embodiment of the present invention.

As shown in FIG. 14, a nanometric mechanical oscillator 10 is disposed at the tip of an optical fiber 41 to face a sample 44. Reference numeral 42 denotes a fiber core, and 43 denotes a fiber cladding.

When the nanometric mechanical oscillator 10 is fixed to the fiber core 42 of the optical fiber 41 as described above, oscillation of the oscillator mass (oscillation element) caused by the sample 44 can be detected optically.

Figure 15:
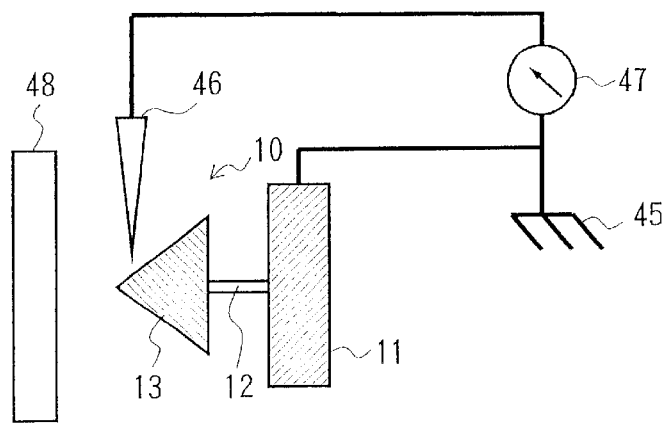
FIG. 15 is a view showing a nanometric mechanical oscillator according to a fifth embodiment of the present invention.

FIG. 15 is a view showing a nanometric mechanical oscillator according to a fifth embodiment of the present invention.

As shown in FIG. 15, a nanometric mechanical oscillator 10 is grounded at 45; and an electron beam emitted from an apparatus (electrode) 46 is radiated on the nanometric mechanical oscillator 10, while being focused to have a diameter on the nanometer order. The mechanical oscillator 10 has electrical conductivity to its base 11, and a portion of the mechanical oscillator 10 exhibits a piezo effect. The mechanical oscillator causes self-excited oscillation due to current flowing upon radiation of the electron beam and deformation of the oscillator due to the current. Variation in the current flowing out of the oscillator 10 is detected by a high-frequency current detector 47 in order to detect the amplitude and frequency of oscillation of the oscillator 10. Reference numeral 48 denotes a sample. Notably, although not illustrated, a tungsten-filament-type electron beam source or field emission of a commercially available ordinary scanning electron microscope is used as an electron beam source; and the generated electron beam is focused by use of an electromagnetic lens system.

Figure 16:
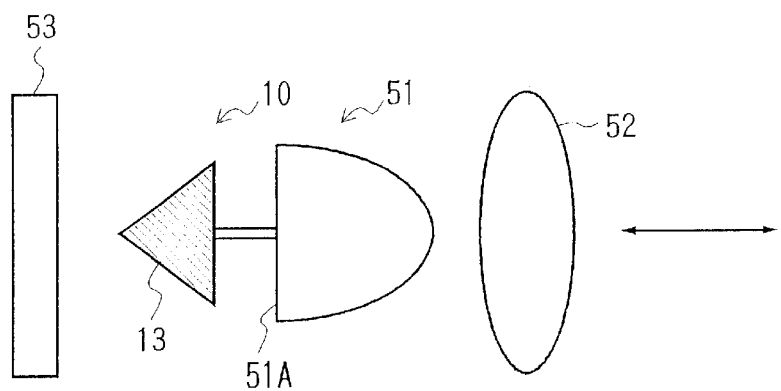
FIG. 16 is a view showing a nanometric mechanical oscillator according to a sixth embodiment of the present invention.

FIG. 16 is a view showing a nanometric mechanical oscillator according to a sixth embodiment of the present invention.

As shown in FIG. 16, a nanometric mechanical oscillator 10 is provided on a nearfield light generation surface 51A of a solid immersion lens 51 such that an oscillator mass 13 faces a sample 53. A laser beam is introduced into the solid immersion lens 51 via a lens 52 and is then returned in the opposite direction.

As described above, through use of the solid immersion lens 51, a spot of light focused to a degree beyond a bendable limit is formed in the base of the nanometric mechanical oscillator 10. The amplitude and frequency of oscillation of the oscillator 10 can be detected on the basis of the return light. Notably, in relation to the solid immersion lens, the below-listed studies are known.

(1) E. Betzig, J. Trautman, R. Volfe, E. Gyorgy, P. Finn, M. Kryder, and C. Chang, Appl. Phys. Lett. 61, 142 (1992).

(2) S. Hosaka, et al. Jpn. J. Appl. Phys. Partl. 35, 443 (1996).

(3) Y. Martin, et al. Appl. Phys. Lett. 71, 1 (1997).

Figure 17:
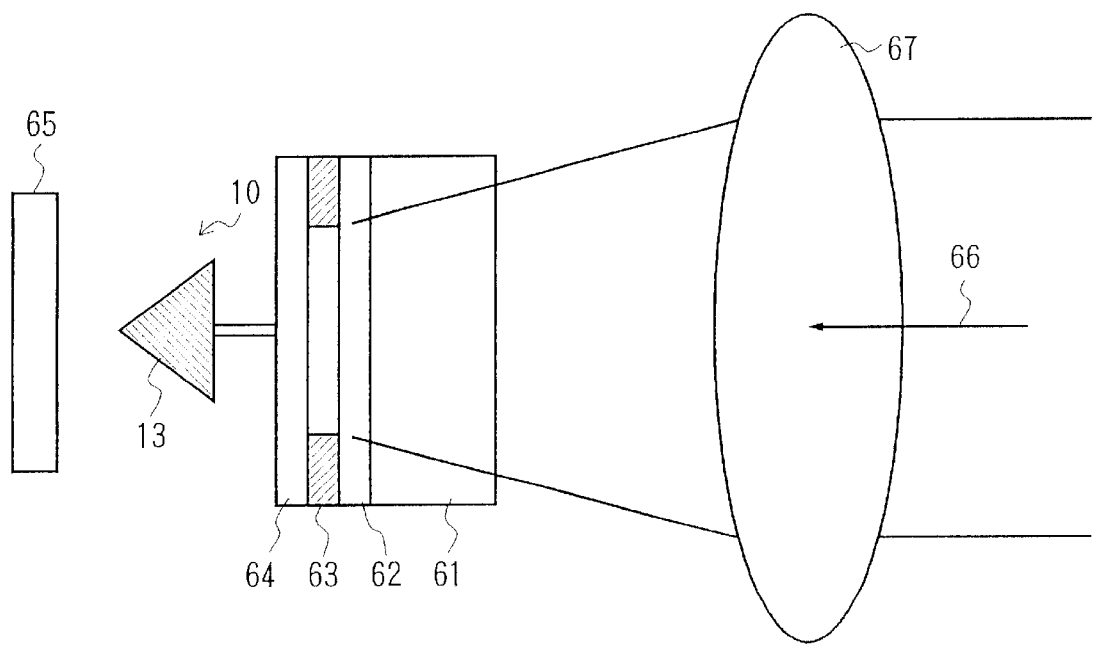
FIG. 17 is a view showing a nanometric mechanical oscillator according to a seventh embodiment of the present invention.

FIG. 17 is a view showing a nanometric mechanical oscillator according to a seventh embodiment of the present invention.

As shown in FIG. 17, a laminated substrate composed of a substrate 61, a dielectric gap layer 62, a mask layer (Sb) 63, and a dielectric layer (gap layer) 64 is provided; and a nanometric mechanical oscillator 10 is disposed on the dielectric layer (gap layer) 64. A sample 65 is disposed in front of the mechanical oscillator 10. A laser beam 66 is radiated onto the back face of the substrate 61 via a lens 67.

As described above, the nanometric mechanical oscillator 10 is fixed onto the laminated substrate having the mask layer 63 formed of Sb. The laminated substrate is called Super-RENS (Supper-resolution Near-field Structure). When a laser beam is radiated onto the mask layer 63, a portion of the mask changes, with resultant establishment of a state equivalent to formation of an opening on the nanometer order. This enables detection of oscillation of the nanometric mechanical oscillator 10 only to thereby reduce background noise. A reference for the Super-RENS is J. Tominaga, et al. Appl. Phys. Lett. 73, 2078 (1988).

FIG. 18 includes views showing a nanometric mechanical oscillator according to an eighth embodiment of the present invention, wherein FIG. 18(*a*) is a side view of the oscillator, and FIG. 18(*b*) is a top view of the oscillator.

In these drawings, reference numeral 71 denotes a quartz-crystal substrate (or silicon substrate having a piezo thin film); 72 denotes comb-shaped electrodes; and 73 denotes an AC voltage source connected to the comb-shaped electrodes 72.

When an AC voltage is applied to the comb-shaped electrodes 72 provided on the quartz-crystal substrate (or silicon substrate having a piezo thin film) 71, surface acoustic waves are generated in order to induce oscillation of the nanometric mechanical oscillator.

FIG. 19 is a view showing a nanometric mechanical oscillator according to a ninth embodiment of the present invention.

In FIG. 19, reference numeral 81 denotes a base; and 82 denotes a particle moving toward a nanometric mechanical oscillator 10.

When the particle 82 collides with the nanometric mechanical oscillator 10, the oscillator mass 13 is displaced in accordance with the law of conservation of momentum, because the oscillator mass 13 is small. Through detection of the displacement, the velocity of the particle can be detected. That is, a particle-velocity detection apparatus can be obtained.

Figure 20:
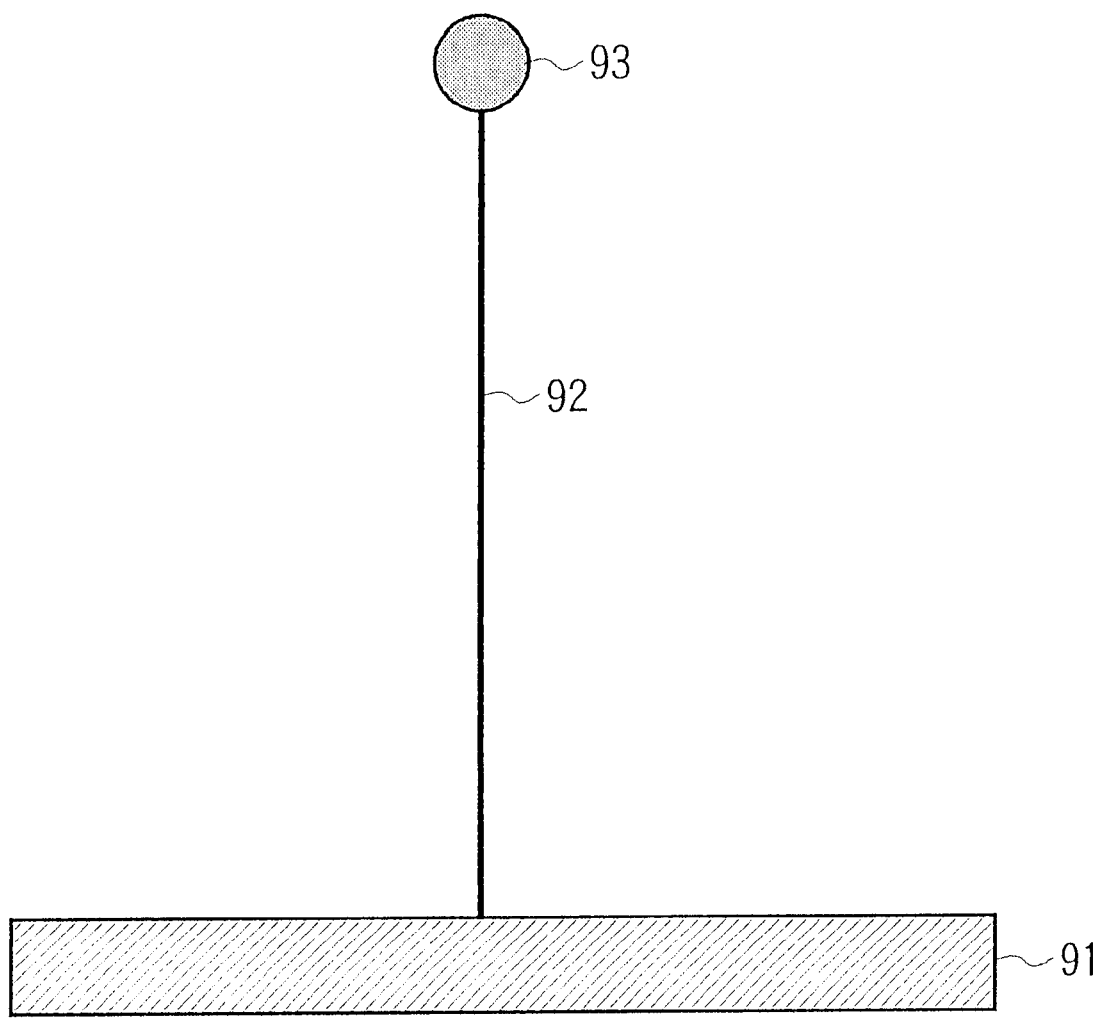
FIG. 20 is a view showing a nanometric mechanical oscillator according to a tenth embodiment of the present invention.

FIG. 20 is a view showing a nanometric mechanical oscillator according to a tenth embodiment of the present invention.

In FIG. 20, reference numeral 91 denotes a base; 92 denotes a columnar, elastic neck portion formed of a very thin, long silicon whisker, which is fabricated in accordance with an LPCVD (low-pressure CVD) method to have a diameter on the order of 10 nm and a length on the order of one micron to one millimeter; and 93 denotes a gold sphere (optionally coated with a magnetic material such as cobalt or nickel) provided at the tip of the neck portion 92.

Thus, a measurement apparatus for detecting acceleration, force, or magnetic force with high sensitivity can be obtained.

Figure 21:
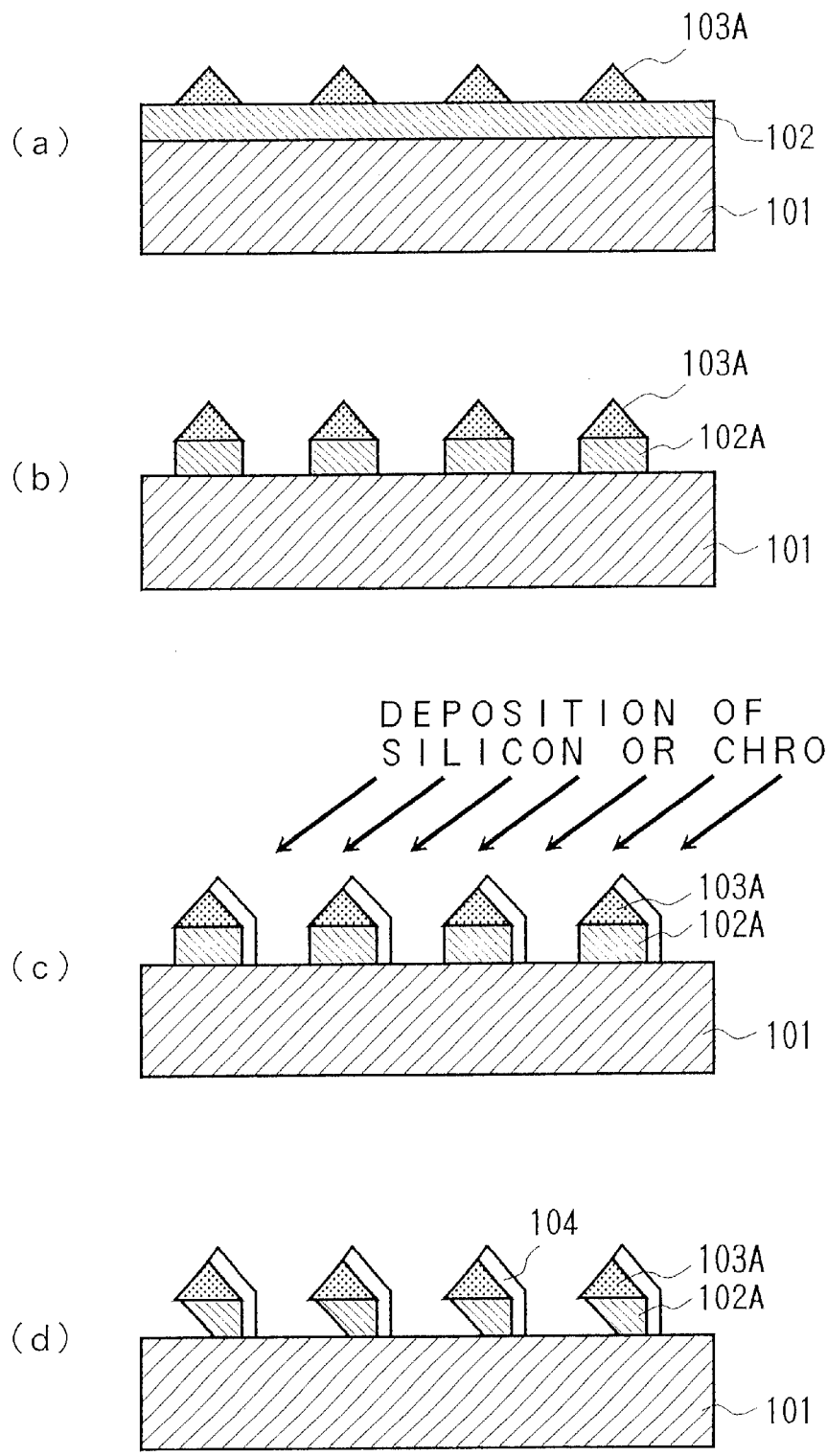
FIG. 21 includes views showing steps of fabricating a nanometric mechanical oscillator according to an eleventh embodiment of the present invention.
Figure 22:
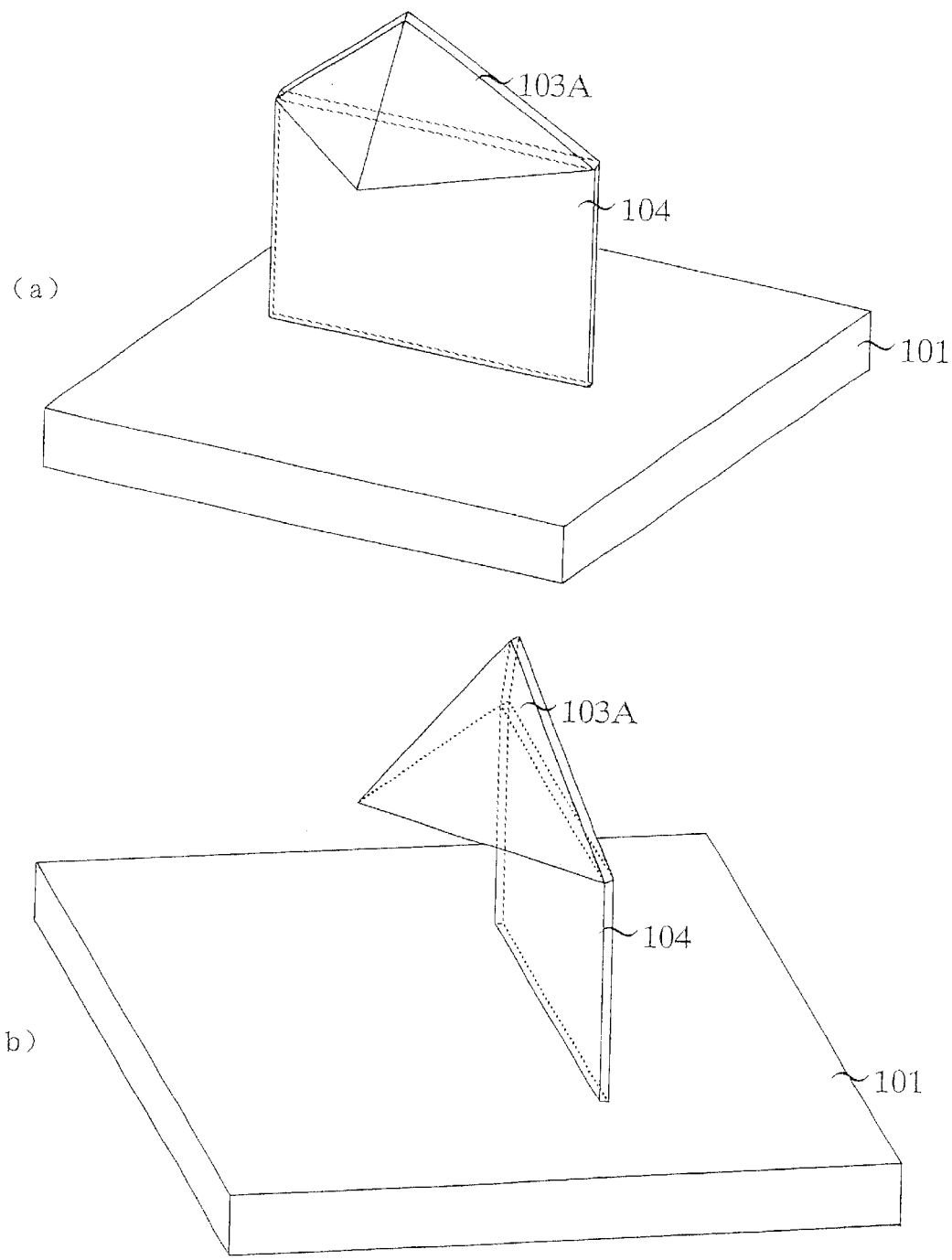
FIG. 22 includes enlarged perspective views of the nanometric mechanical oscillator according to the eleventh embodiment of the present invention.
Figure 23:
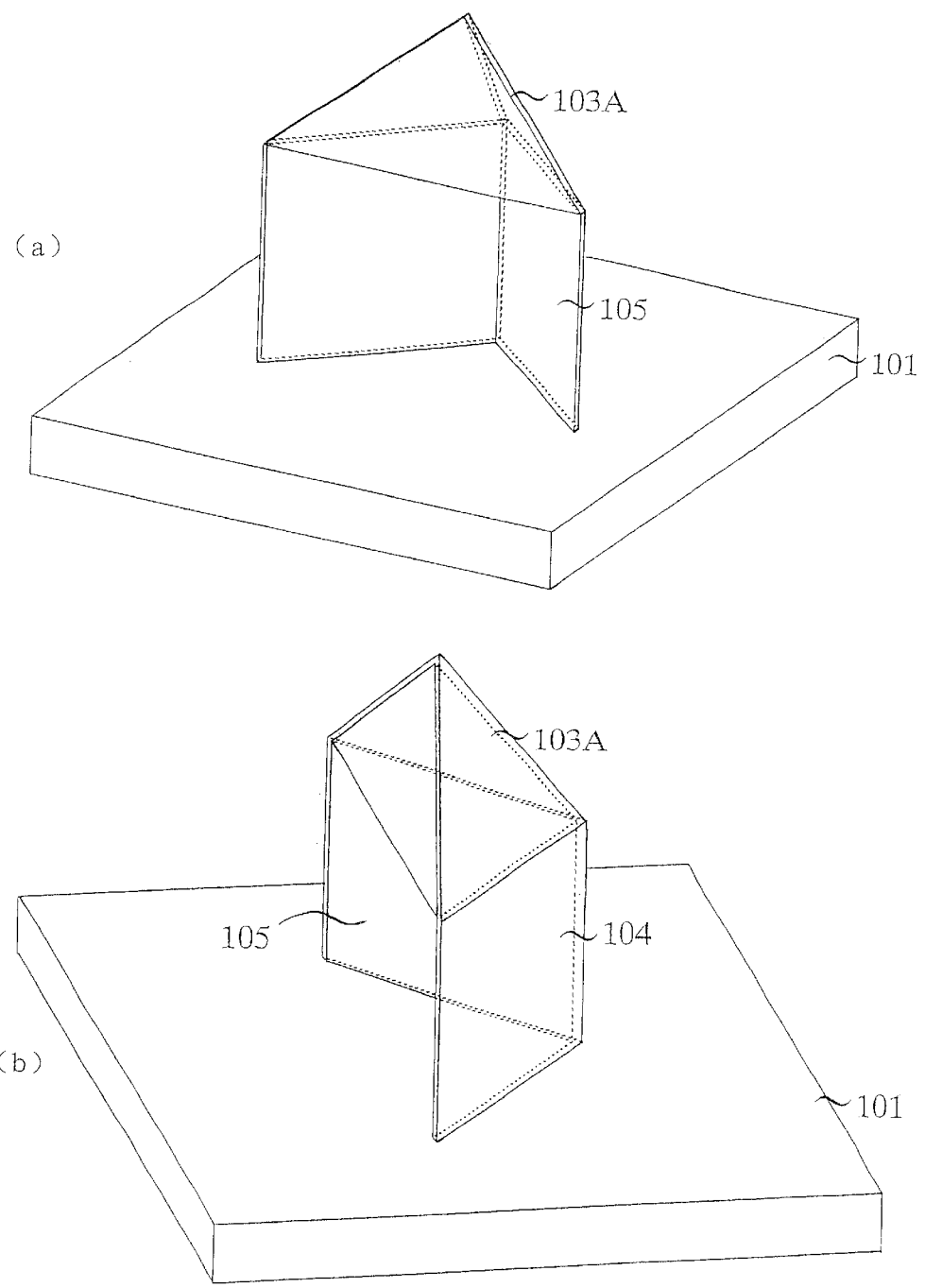
FIG. 23 includes perspective views of a microcapsule according to the eleventh embodiment of the present invention.

FIG. 21 includes cross-sectional views showing steps of fabricating a nanometric mechanical oscillator according to an eleventh embodiment of the present invention. FIG. 22 includes enlarged perspective views of the nanometric mechanical oscillator, wherein FIG. 22(a) is a front view, and FIG. 22(b) is a side view. FIG. 23 includes perspective views of a microcapsule, wherein FIG. 23(a) is a front view, and FIG. 23(b) is a side view.

(1) First, as shown in FIG. 21(a), a silicon oxide film 102 and a silicon film are successively formed on a silicon substrate 101. The silicon film is machined to tetrahedral silicon projections 103A through anisotropic etching.

(2) Subsequently, as shown in FIG. 21(b), the silicon oxide film is etched in a direction normal to the substrate, while the tetrahedral silicon projections 103A are used as a mask, in order to form silicon oxide columns 102a.

(3) Subsequently, as shown in FIG. 21(c), silicon or chromium is vapor-deposited along an oblique direction with respect to the silicon substrate 101. During the vapor deposition, each tetrahedral silicon projection (triangular pyramid) 103A is oriented such that one side surface thereof faces a vapor deposition source. Thus, silicon or chromium is vapor-deposited on one side surface of each tetrahedral silicon projection 103A and on one side surface of each silicon oxide column 102A. Notably, silicon or chromium may be vapor-deposited on two side surfaces of each tetrahedral silicon projection 103A and on two side surfaces of each silicon oxide column 102A.

(4) Subsequently, as shown in FIG. 21(d), the silicon oxide columns 102A are removed by use of hydrofluoric acid. As a result, as shown in FIG. 22, a tetrahedral probe supported by an elastic neck portion 104 formed of silicon or chromium and assuming the shape of a single flat plate is obtained. The size of the probe is defined by the tetrahedral silicon projection 103A obtained through anisotropic etching, as well as the thickness thereof. In the above-described manner, the probe on the order of 100 nm can be fabricated stably. Further, when silicon or chromium is vapor-deposited on two side surfaces of each tetrahedral silicon projection 103A and on two side surfaces of each silicon oxide column 102A, an optical probe or sample capturing capsule having a microcapsule or a very small opening 105 as shown in FIG. 23 can be obtained.

In contrast to the case of a conventional method for forming an opening for generation of a photo nearfield in which a sharp optical fiber is coated with a metal and the metal is removed from the tip portion of the fiber, in the present embodiment, silicon or metal is vapor-deposited on a structure, which is formed from silicon and silicon oxide with very small variation in size and which serves as a nucleus; and subsequently, the oxide silicon is removed. Therefore, a single probe can be fabricated or a large number of probes can be fabricated simultaneously in such a manner that each probe has an opening having an accurately controlled size.

The tetrahedral probe supported by the thin-film elastic portion (neck portion) formed through oblique vapor deposition can be used in a scanning force microscope in such a manner that an apex or a corner located apart from the support portion serves as a probe tip.

Further, a capsule having the very small opening 105 as shown in FIG. 23 can be fabricated to have a size on the order of 10 nm to 1 μm and can be used for an opening for capturing a sample or for generating a photo nearfield.

Figure 24:
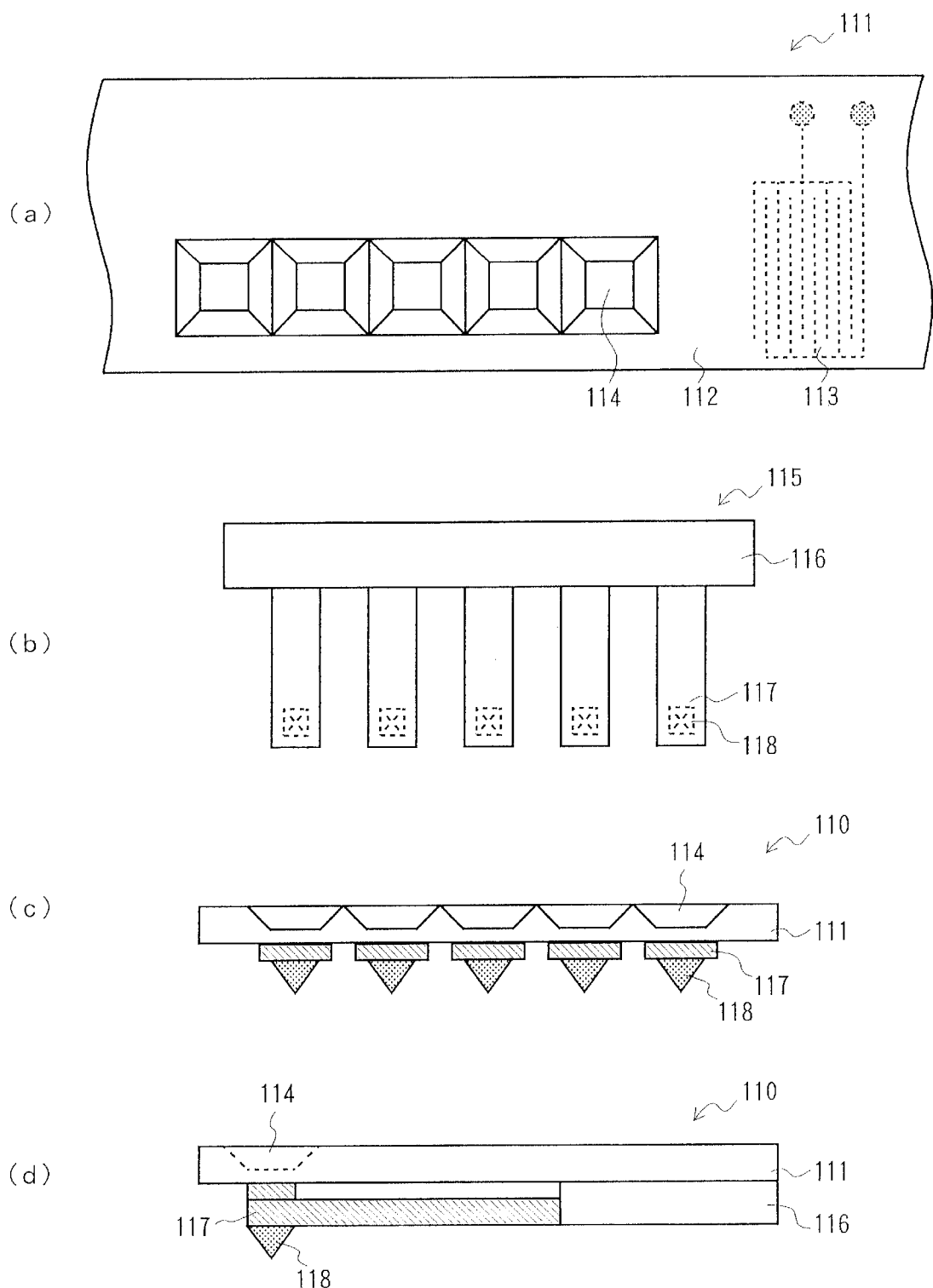
FIG. 24 includes configurational views of a nanometric mechanical oscillator according to a twelfth embodiment of the present invention.

FIG. 24 includes configurational views of a nanometric mechanical oscillator according to a twelfth embodiment of the present invention, wherein FIG. 24(a) is a top view of a first layer, FIG. 24(b) is a top view of a second layer, FIG. 24(c) is a front view of the entire oscillator, and FIG. 24(d) is a side view of the entire oscillator.

As shown in these drawings, the first layer 111 (FIG. 24(a)) includes a piezo substrate 112, a surface-acoustic-wave generation unit (formed on the reverse side) 113, and depressions 114 formed in the piezo substrate 112 at locations corresponding to a large number of arrayed cantilevers having probes.

As shown in FIG. 24(b), the second layer 115 has a base portion 116 and a large number of arrayed cantilevers 117 projecting from the base portion 116 and having probes 118.

The first layer 111 and the second layer 115 are superposed on each other to thereby obtain an element 110 as shown in FIGS. 24(c) and 24(d). In the element 110, surface acoustic waves are generated within the piezo substrate 112 along two directions in a plane to thereby cause the probes to sequentially approach a measurable region of a sample.

Figure 25:
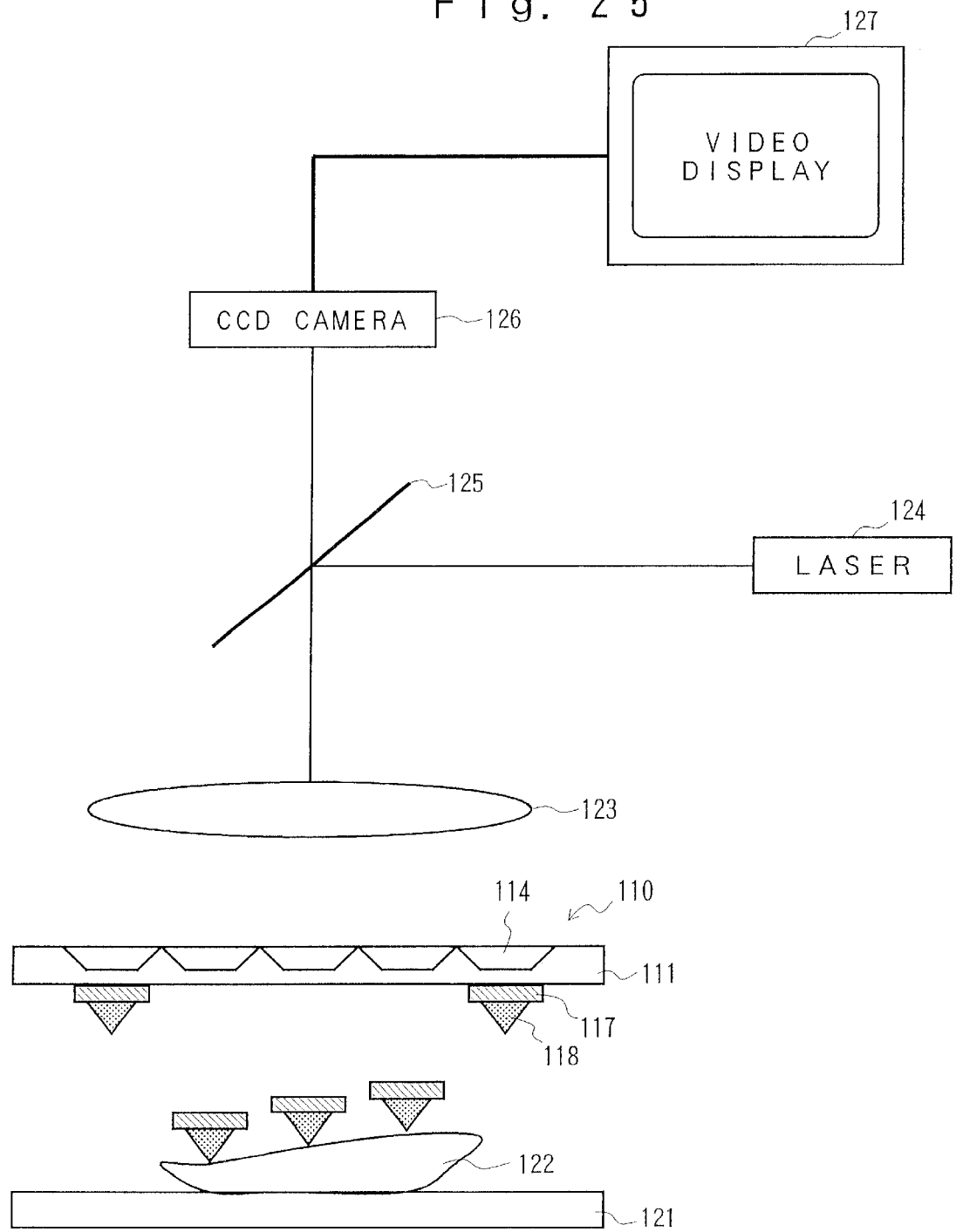
FIG. 25 is a configurational view of a measurement system for measuring a sample by use of an element having a large number of arrayed cantilevers having probes, which was fabricated as shown in FIG. 24.

FIG. 25 is a configurational view of a measurement system for measuring a sample by use of an element having a large number of arrayed cantilevers having probes, which was fabricated as shown in FIG. 24.

In FIG. 25, reference numeral 121 denotes a sample table; and 122 denotes a sample placed on the sample table 121. The sample 122 is measured in such a manner that the element 110 equipped with the large number of arrayed cantilevers 117 having the probes 118 is caused to sequentially approach a measurable region of the sample 122. The measurement system includes a lens system 123, a laser 124, a half mirror 125, a CCD camera 126, and a video display 127 connected to the CCD camera 126 and serving as a display unit.

Figure 26:
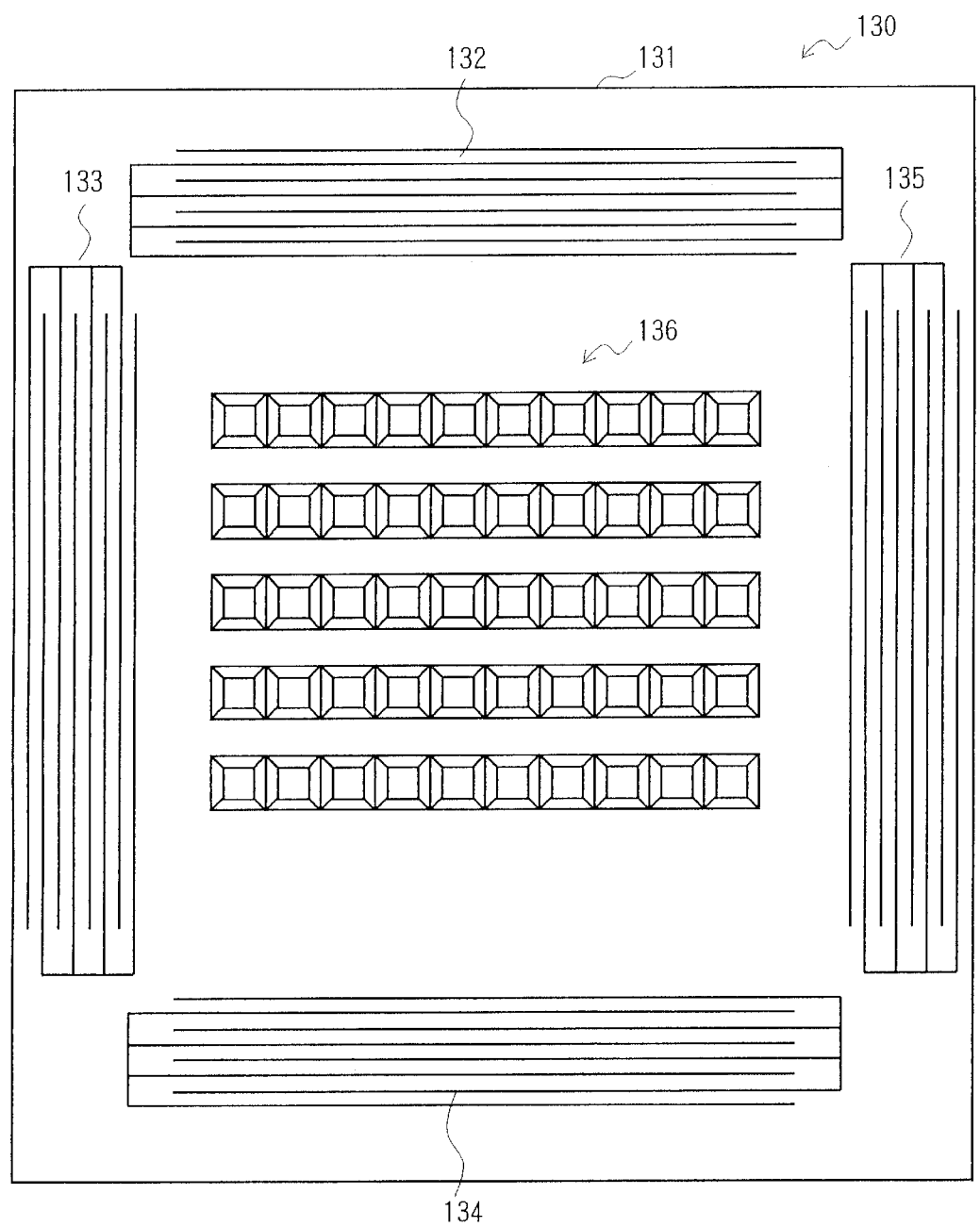
FIG. 26 is a top view of the substrate of an element having a large number of arrayed cantilevers according to a modification of the twelfth embodiment of the present invention.

FIG. 26 is a top view of the substrate of an element having a large number of arrayed cantilevers according to a modification of the twelfth embodiment of the present invention.

As shown in FIG. 26, the element 130 includes a piezo substrate 131; surface-acoustic-wave generation units 132, 133, 134, and 135 formed along the four sides of the piezo substrate 131 (formed on the reverse surface); and a large number of cantilevers 136 arrayed in a matrix at the center portion of the piezo substrate 131. FIG. 26 shows an example in which cantilevers are arranged two-dimensionally to form a 5×10 matrix.

Figure 27:
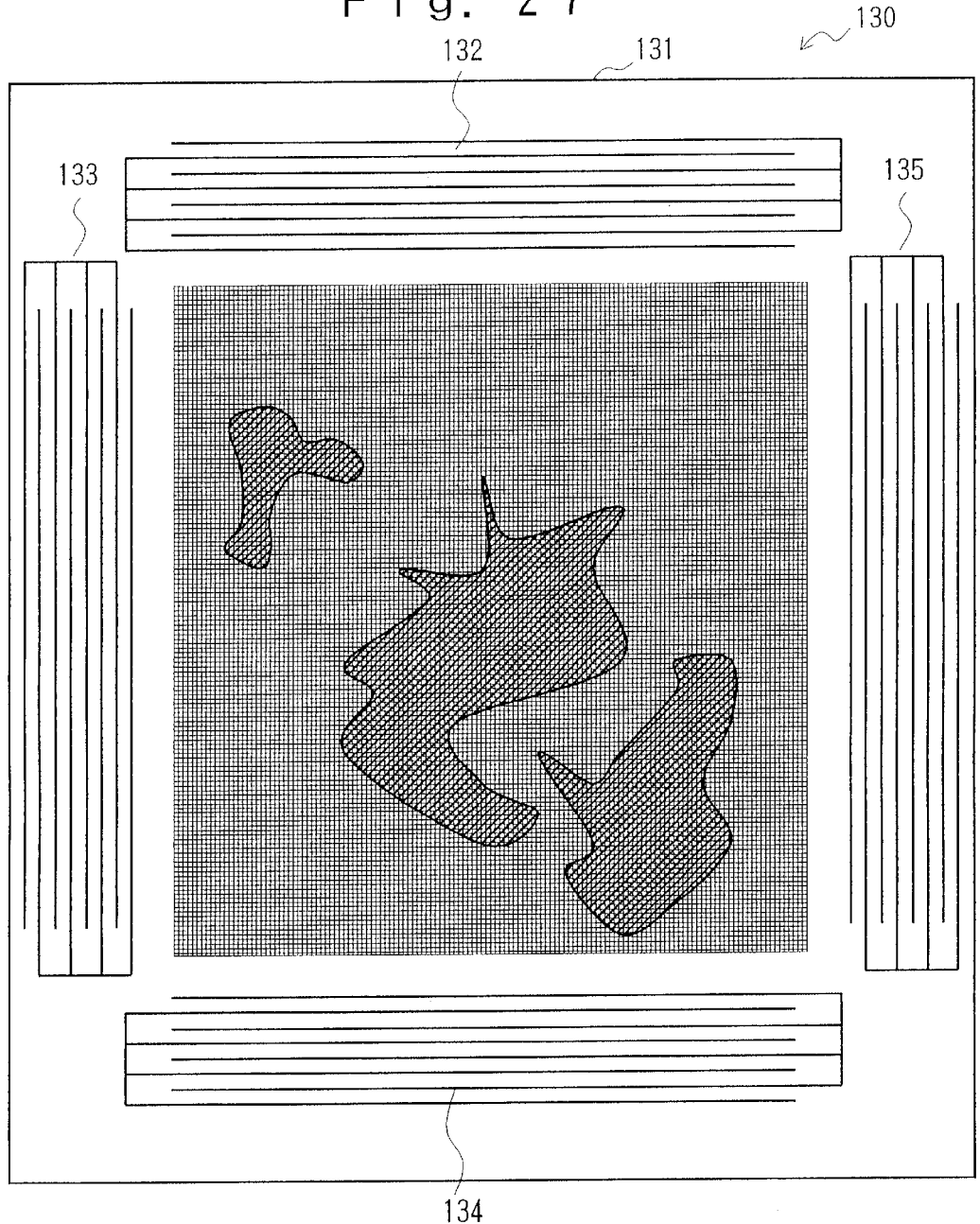
FIG. 27 is an. explanatory view regarding the twelfth embodiment of the present invention and demonstrating that the shape and characteristics of a sample can be visualized.

When a sample is observed by use of the element shown in FIG. 26 having a large number of two-dimensionally arranged cantilevers, an interference cavity corresponding to each cantilever imparts brightness to a corresponding pixel, so that the shape and characteristics of the sample can be visualized as a whole, as is apparent from the explanatory view of FIG. 27.

Figure 28:
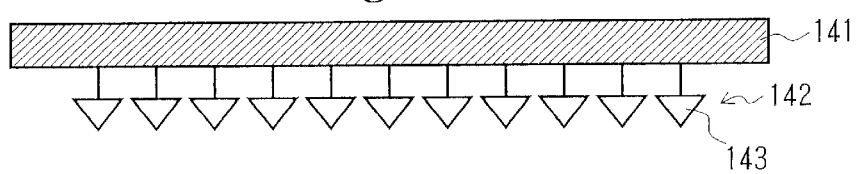
FIG. 28 is a schematic view of a nanometric mechanical oscillator according to a thirteenth embodiment of the present invention.

FIG. 28 is a schematic view of a nanometric mechanical oscillator according to a thirteenth embodiment of the present invention.

In the embodiment shown in FIG. 28, a large number of nanometric mechanical oscillators 142 are arrayed on a substrate 141 formed of a piezo material. Surface acoustic waves are caused to propagate along two directions in a plane, so that the probes 143 are caused to sequentially approach a measurable region of the sample 143 by means of propagating waves or standing waves.

Incorporating a drive element or displacement detection element into each of the large number of arrayed mechanical oscillators 142 is not easy. Even through such mechanical oscillators can be fabricated, processing a large number of signals output from the large number of cantilevers at high speed is difficult.

In the above-described embodiment, the large number of arrayed cantilevers are excited to oscillate by means of surface acoustic waves, which are caused to propagate along the surface with which the cantilevers come into contact in a stationary condition, whereby the probes fixed to the surfaces of the cantilevers facing the sample are caused to approach the sample. A position at which each probe comes into contact with the sample is measured on the basis of an average brightness obtained from the interference cavity formed between the back surface of the cantilever and the lower surface of the first layer.

The above-described configuration enables a large number of cantilevers to sequentially oscillate by means of surface-acoustic-wave generation units fabricated at the ends of the cantilever array and to measure the positions at which the large number of cantilevers come into contact with a sample as brightness of laser interference cavities of the respective cantilevers. The system may be configured in such a manner that brightness of each interference cavity reflects on brightness of the corresponding pixel of the video monitor. Alternatively, the system may be configured in such a manner that a sample is scanned along a sample plane relative to the cantilever array, so that each interference cavity imparts brightness to several pixels. The surface acoustic waves may be continuous waves or burst waves. Through synchronization of burst waves, it becomes possible to excite oscillation while preferentially selecting one of various oscillation modes of cantilevers. Further, through utilization of a phenomenon that a sample behaves differently depending on the oscillation frequency of the probe, the distribution of material properties inside the sample can be visualized. Notably, the present invention can be applied not only to measurement of samples but also to processing, including reading and writing of digital data.

Moreover, it becomes possible to generate surface acoustic waves or Lamb waves in the base to which the nanometric mechanical oscillators are fixed in order to cause the mechanical oscillators to sequentially approach a sample, to thereby measure or process the sample.

Figure 29:
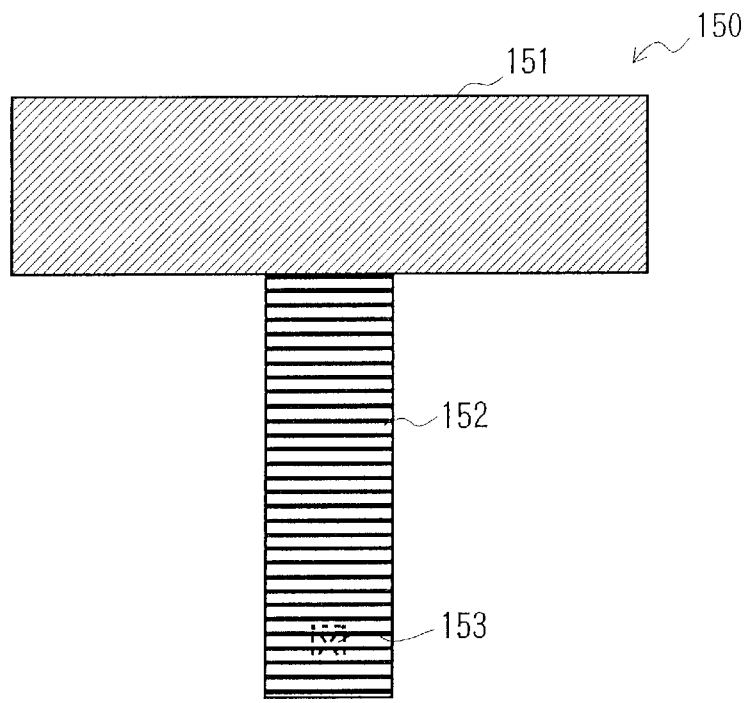
FIG. 29 is a configurational view of a nanometric mechanical oscillator according to a fourteenth embodiment of the present invention.

FIG. 29 is a configurational view of a nanometric mechanical oscillator according to a fourteenth embodiment of the present invention.

As shown in FIG. 29, a nanometric mechanical oscillator 150 of the present embodiment includes a base 151, a cantilever 152 formed of plastic, and a probe 153 attached to the tip of the cantilever 152. The cantilever 152 contains powder of a magnetic material and is magnetized in a stripe pattern. That is, the cantilever 152 is mainly formed of plastic containing magnetic powder magnetized along a direction intersecting the axial direction of the cantilever.

In the present embodiment, since magnetic powder magnetized in a specific pattern or along a specific direction is incorporated into the cantilever, it becomes possible to preferentially induce higher-order oscillations in the cantilever by means of an external alternating magnetic field.

Figure 30:
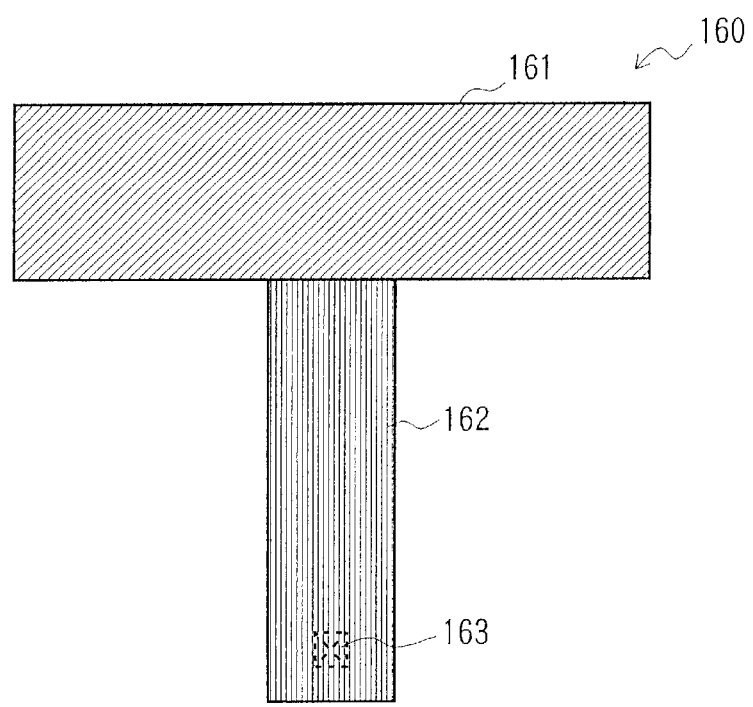
FIG. 30 is a configurational view of a nanometric mechanical oscillator according to a fifteenth embodiment of the present invention.

FIG. 30 is a configurational view of a nanometric mechanical oscillator according to a fifteenth embodiment of the present invention.

As shown in FIG. 30, a nanometric mechanical oscillator 160 of the present embodiment includes a base 161, a cantilever 162 formed of plastic, and a probe 163 attached to the tip of the cantilever 162. The cantilever 162 contains whisker crystals arranged along a specific direction or in a specific pattern. That is, the cantilever 162 is mainly formed of plastic containing whisker crystals arranged along the axial direction of the cantilever.

In the present embodiment, since whisker crystals arranged along a specific direction or in a specific pattern are incorporated into the cantilever, it becomes possible to impart to the cantilever anisotropy in mechanical properties and electrical properties, which anisotropy cannot be obtained in a cantilever formed of a single material only.

Figure 31:
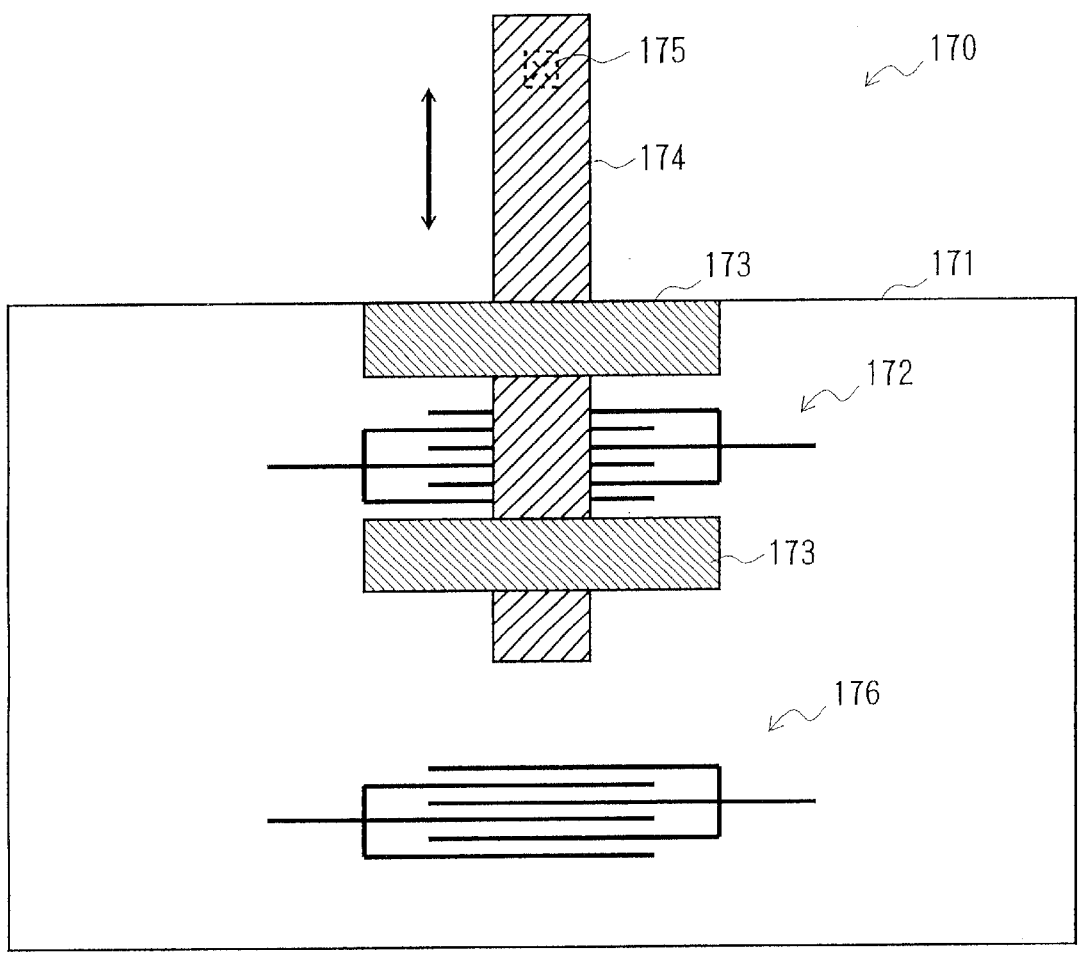
FIG. 31 is a configurational view of a nanometric mechanical oscillator according to a sixteenth embodiment of the present invention.

FIG. 31 is a configurational view of a nanometric mechanical oscillator according to a sixteenth embodiment of the present invention.

As shown in FIG. 31, a nanometric mechanical oscillator 170 of the present embodiment includes a base 171, a cantilever 174, and a probe 175 attached to the tip of the cantilever 174 (on the reverse side). The cantilever 174 is guided by guides 173. Two surface-acoustic-wave generation units 172 and 176 each serving as an actuator are disposed on the base 171. Thus, the cantilever 174 can be moved in order to change the effective length thereof.

When a sample is observed under a scanning force microscope by use of a cantilever of fixed length, the distribution of material properties of a sample can be investigated on the basis of the manner of generation of higher order modes of oscillation of the cantilever. However, since the length of the cantilever is fixed, measurement can be performed at discrete frequencies only. In the present embodiment, since a cantilever having a variable length is realized, the oscillation frequency of the cantilever can be swept continuously or swept within a wide frequency range. As a result, more accurate measurement of sample characteristics becomes possible; and a small distribution of material properties within a sample, which has been impossible to observe, can be visualized.

Figure 32:
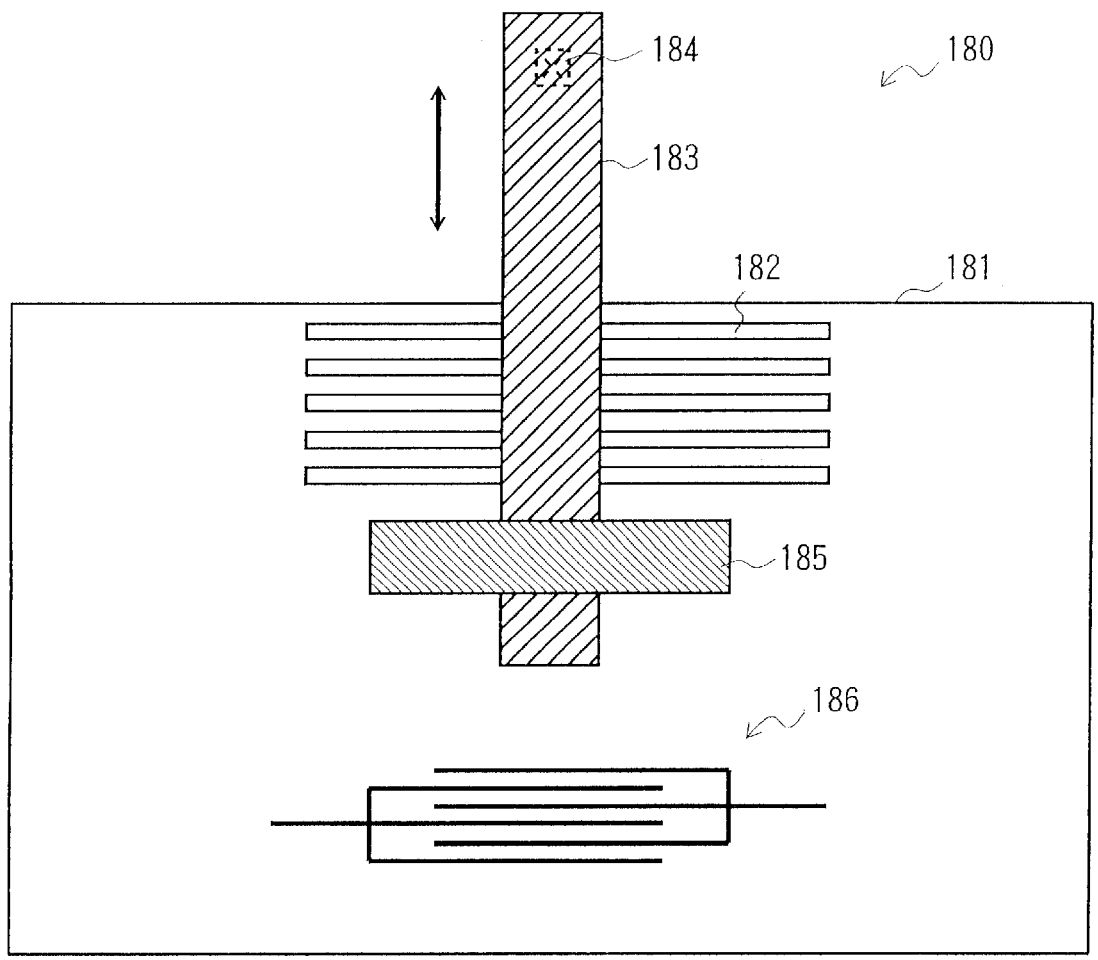
FIG. 32 is a configurational view of a nanometric mechanical oscillator according to a seventeenth embodiment of the present invention.
Figure 34:
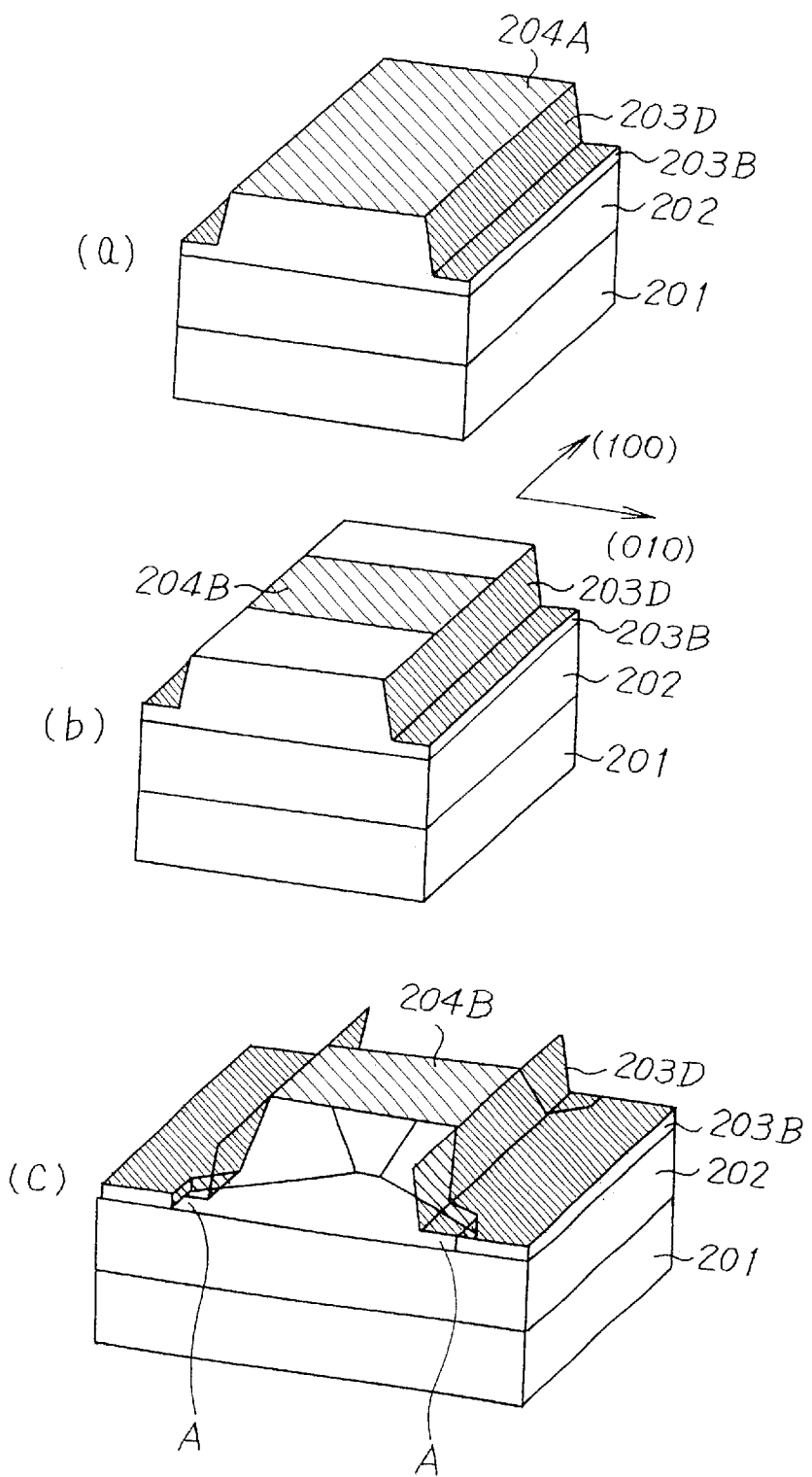
FIG. 34 includes views showing steps, subsequent to the steps shown in FIG. 33, of fabricating a nanometric mechanical oscillator according to the eighteenth embodiment of the present invention.
Figure 35:
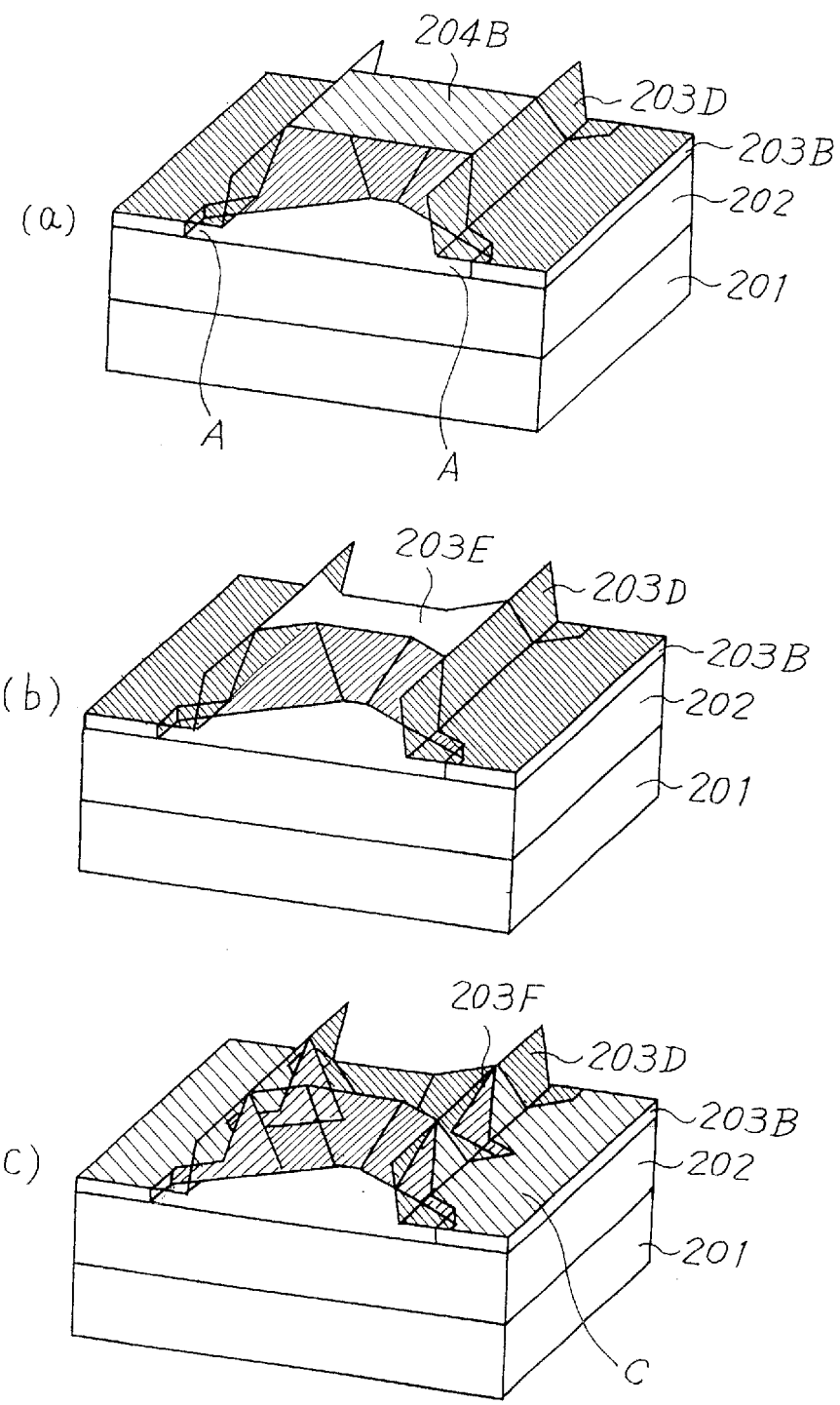
FIG. 35 includes views showing steps, subsequent to the steps shown in FIG. 34, of fabricating a nanometric mechanical oscillator according to the eighteenth embodiment of the present invention.
Figure 36:
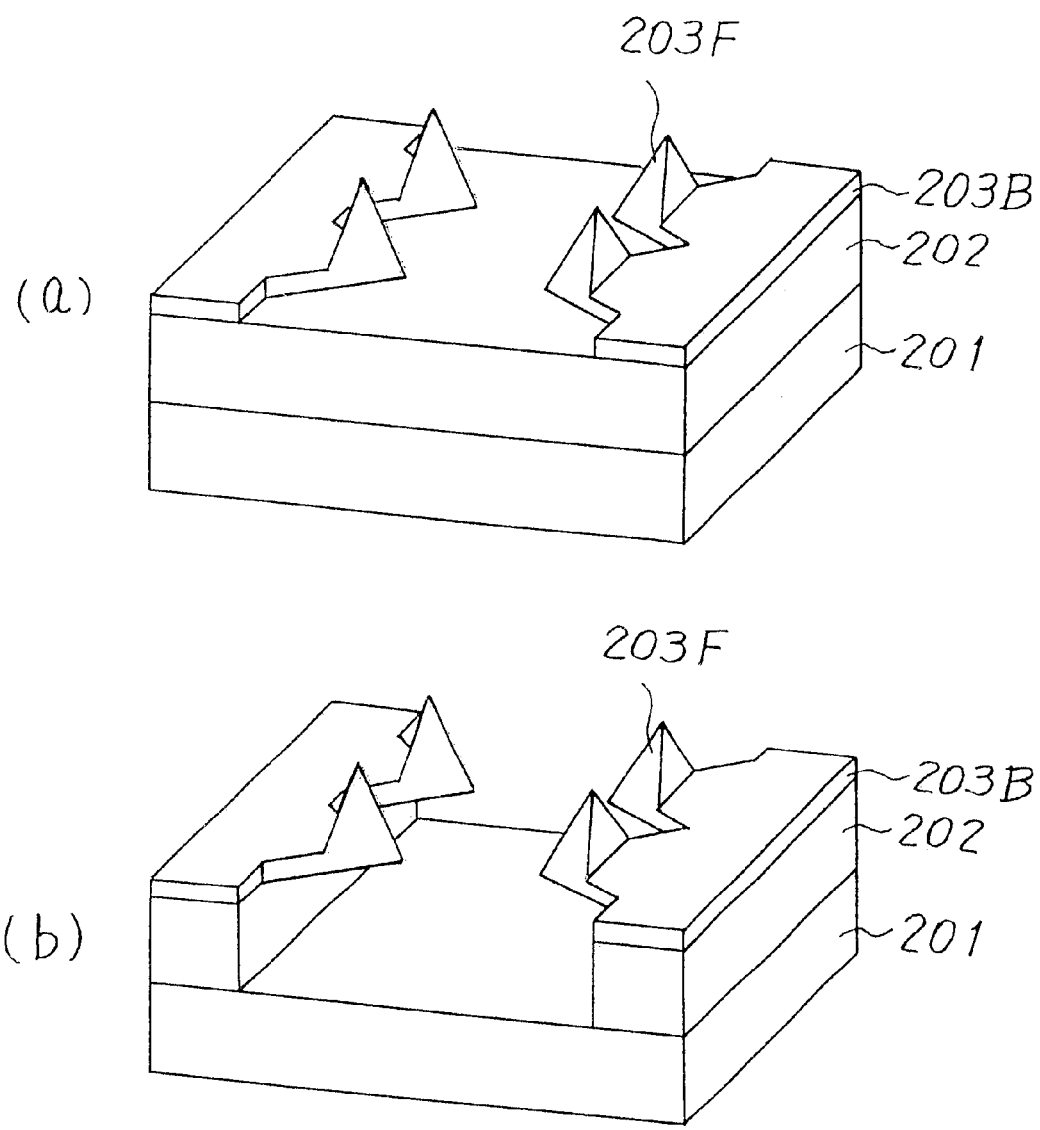
FIG. 36 includes views showing steps, subsequent to the steps shown in FIG. 35, of fabricating a nanometric mechanical oscillator according to the eighteenth embodiment of the present invention.

FIG. 32 is a configurational view of a nanometric mechanical oscillator according to a seventeenth embodiment of the present invention.

As shown in FIG. 32, a nanometric mechanical oscillator 180 of the present embodiment includes a series of attraction electrodes 182, which are disposed to surround one end portion of a cantilever 183 disposed on a base 181. The attraction electrodes 182 selectively attract different portions of the cantilever 183 by means of electrostatic attraction force to thereby move the cantilever 183 and thus change the effective length of the cantilever 183. Reference numeral 184 denotes a probe; 185 denotes a guide; and 186 denotes a surface-acoustic-wave generation unit.

Moreover, when the length of the cantilever is variable, the fundamental oscillation frequency and the higher order mode can be swept. Therefore, through fabrication of a surface-acoustic-wave generation element in the vicinity of the base end of the cantilever, it becomes possible to sweep the fundamental oscillation frequency and the higher order mode within a wide frequency band.

FIGS. 33 to 36 are views showing steps of fabricating a nanometric mechanical oscillator according to an eighteenth embodiment of the present invention.

(1) First, as shown in FIG. 33(a), an SOI (silicon on insulator) wafer consisting of an Si layer (thickness: 1 to 3 μm) 203, an SiO$_2$ layer 202, and an Si layer 201 is prepared. The Si layer 203 has a thickness of 1 to 3 μm, thereby determining the size of triangular pyramids 203F each serving as a mass of a cantilever (see FIG. 36, which will be described later).

(2) Subsequently, as shown in FIG. 33(b), an Si$_3$N$_4$ film thickness: 20 nm) 204 is deposited on the Si layer 203 through LPCVD.

(3) Subsequently, as shown in FIG. 33(c), a rectangular resist is applied along the (100) direction, and the Si$_3$N$_4$ film 204 is etched by means of RIE (reactive ion etching), so that an Si$_3$N$_4$ film 204A remains.

(4) Subsequently, as shown in FIG. 33(d), while the Si$_3$N$_4$ film 204A is used as a mask, the upper Si layer 203 is etched by use of KOH or RIE. At this time, the etching time is controlled such that the residual portions 203B of the upper Si layer 203 have a thickness of 100 to 200 nm. The thickness of the residual Si layer 203B determines the thickness of the spring of the cantilever. Notably, the thickness of the residual Si layer 203B is determined in consideration of the thickness of the Si layer 203B decreasing by 30 nm due to thermal oxidation in steps (5) and (8), which will be described later, so that the thickness of the Si layer 203B decreases by 60 nm in total.

(5) Subsequently, as shown in FIG. 34(a), Si thermal oxidation is performed by means of Si local oxidation (LOCOS) to thereby form an Si oxide film 203D.

(6) Subsequently, as shown in FIG. 34(b), a rectangular resist is applied along the (010) direction, and the Si$_3$N$_4$ film 204A is etched by means of RIE, so that an Si$_3$N$_4$ film 204B remains.

(7) Subsequently, as shown in FIG. 34(c), while the Si$_3$N$_4$ film 204B and the Si oxide film formed in the step of FIG. 34(a) are used as a mask, the upper Si layer 203 is etched anisotropically by use of KOH. When {111} planes passing through the four corners of the Si$_3$N$_4$ film 204B are exposed, the lower SiO$_2$ layer (intermediate oxide film) 202 emerges. Further, portions A of the Si layer 203B are etched in the (010) direction upon further progress of the anisotropic etching by use of KOH. This determines the length of the spring of the cantilever. Since the {111} planes are not etched during the etching, the etching does not affect the positions and size of the triangular pyramids 203F each serving as a cantilever mass (see FIG. 36, which will be described later).

(8) Subsequently, as shown in FIG. 35(a), Si thermal oxidation is performed by means of Si local oxidation (LOCOS).

(9) Subsequently, as shown in FIG. 35(b), the Si$_3$N$_4$ film 204B is removed by use of H$_3$PO$_4$ to thereby expose the top face of the Si layer 203E.

(10) Subsequently, as shown in FIG. 35(c), while the oxide film formed in the step of FIG. 34(a) and the oxide film formed in the step of FIG. 35(a) are used as a mask, the Si layer 203E is etched anisotropically by use of KOH. Thus, {111} planes starting from the four corners of the Si$_3$N$_4$ film 204B film are formed. These planes are oriented to intersect the {111} planes formed in the step of FIG. 34(c) at an angle of 90°. The lower SiO$_2$ layer 202 emerges. Further, portions C of the Si layer 203B are etched in the (010) direction upon further progress of the anisotropic etching by use of KOH, in such a manner that the portions C have the same length as that of the portion A formed in the step of FIG. 34(c). This determines the length of the spring of the cantilever. During this etching, since the {111} planes are not etched, the etching does not affect the positions and size of the triangular pyramids 203F each serving as a cantilever mass (see FIG. 36, which will be described later).

(11) Subsequently, as shown in FIG. 36(a), the oxide films (LOCOS) which were formed in the steps of FIGS. 34(a) and 35(a), respectively, and served as a mask for KOH anisotropic etching in the steps of FIGS. 34(c) and 35(c) are removed.

(12) Finally, as shown in FIG. 36(b), after patterning parallel to the (100) direction, the SiO$_2$ is etched by use of BHF so as to form, in an overhung condition, a cantilever in which the Si triangular pyramids 203F serving as masses are supported by the Si layer 203B.

Figure 37:
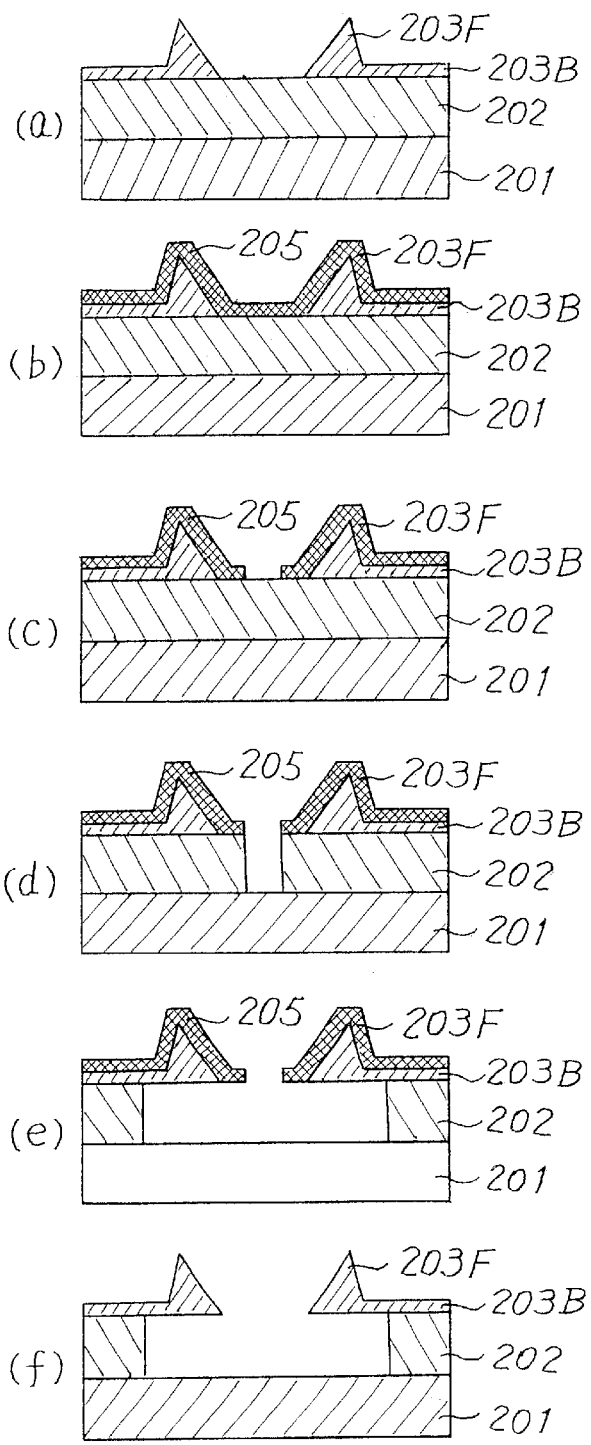
FIG. 37 includes sectional views showing the twelfth step of the fabrication process according to the eighteenth embodiment.

Step (12) will be described in detail with reference to FIGS. 37 and 38.

① First, as shown in FIGS. 37(a) and 38(a), a structure such that the Si triangular pyramids 203F are supported by the Si layer 203B is formed.

② Subsequently, as shown in FIG. 37(b), a Cr film 205 or a like film which can endure BHF and can be selectively removed later is formed through, for example, sputtering.

③ Subsequently, as shown in FIG. 37(c), the Cr film 205 is patterned parallel to the (100) direction.

④ Subsequently, as shown in FIGS. 37(d) and 38(b), the SiO$_2$ layer 202 is etched vertically by means of RIE.

⑤ Subsequently, as shown in FIG. 37(e), the SiO$_2$ layer 202 is etched laterally by use of BHF in order to form cantilevers in an overhung state.

⑥ Subsequently, as shown in FIGS. 37(f) and 38(c), the Cr film 205 is removed by HY.

Figure 39:
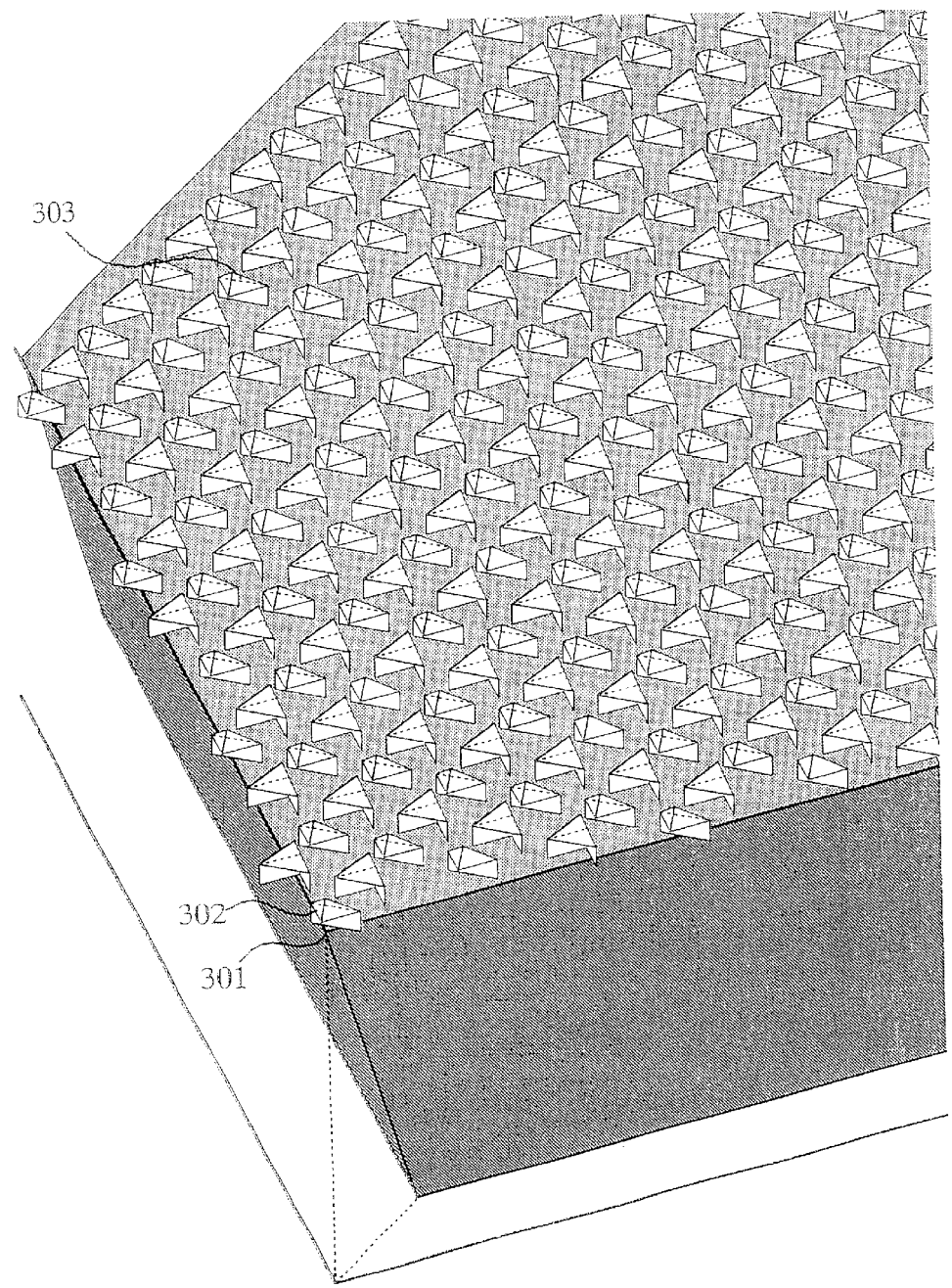
FIG. 39 is a view showing a cantilever array according to a nineteenth embodiment of the present invention in which an oscillator having a triangular-pyramidal probe is provided at the tip end of a chip.
Figure 40:
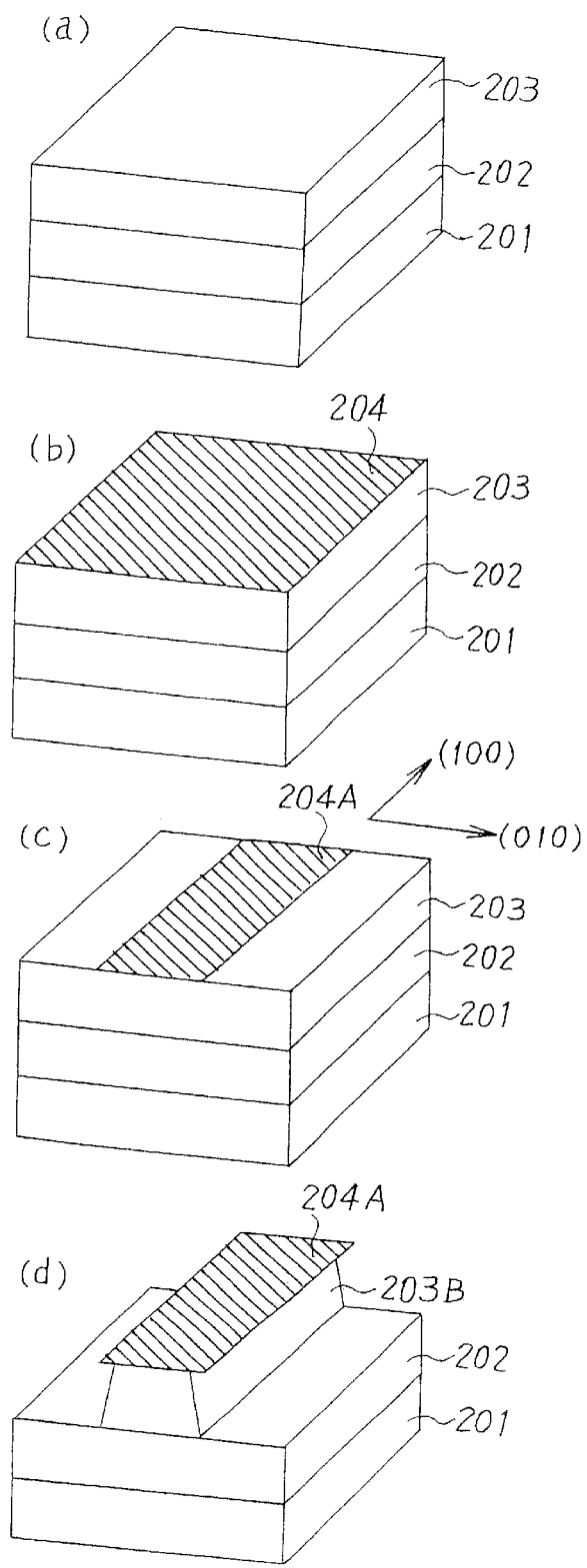
FIG. 40 includes views showing steps of fabricating a parallel-spring-supported oscillator according to a twentieth embodiment of the present invention.
Figure 41:
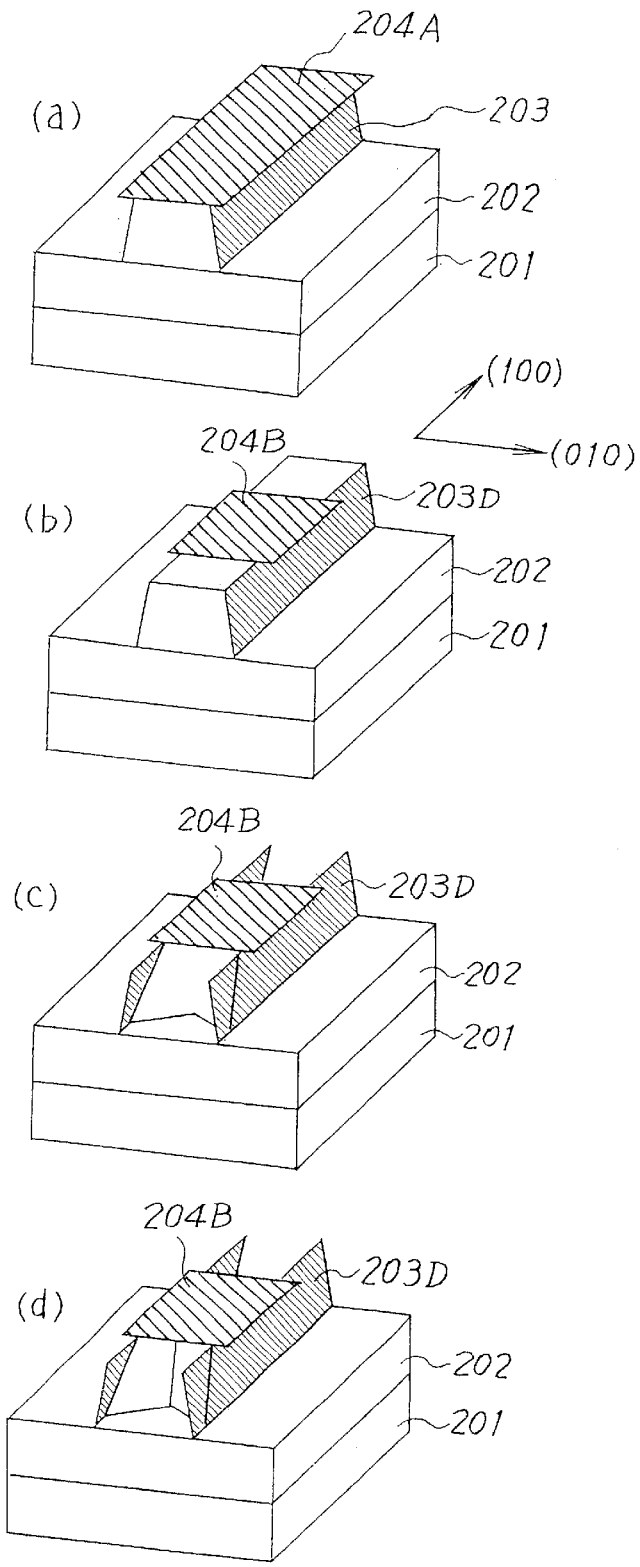
FIG. 41 includes views showing steps, subsequent to the steps shown in FIG. 40, of fabricating the parallel-spring-supported oscillator according to the twentieth embodiment of the present invention.
Figure 44:
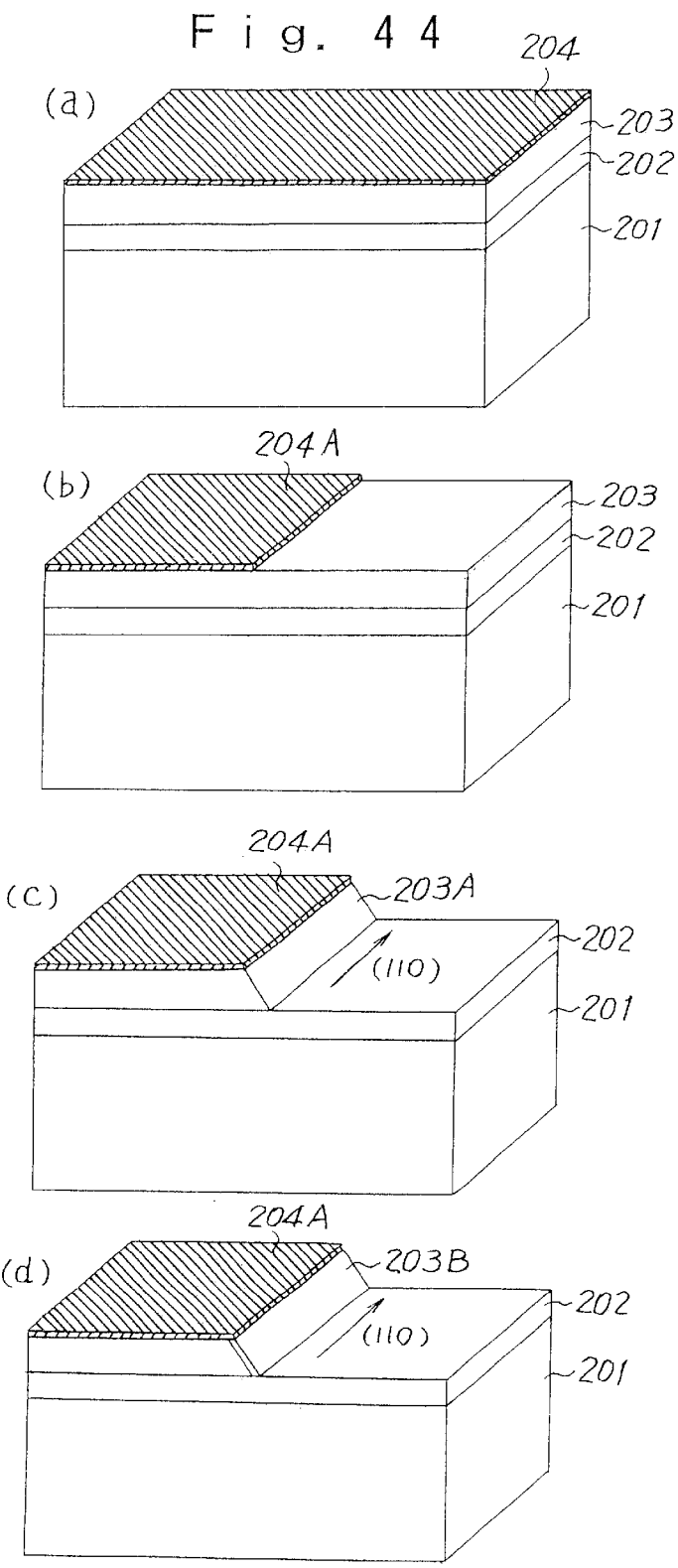
FIG. 44 includes views showing steps of fabricating a parallel-spring-supported oscillator according to a twenty-first embodiment of the present invention.
Figure 45:
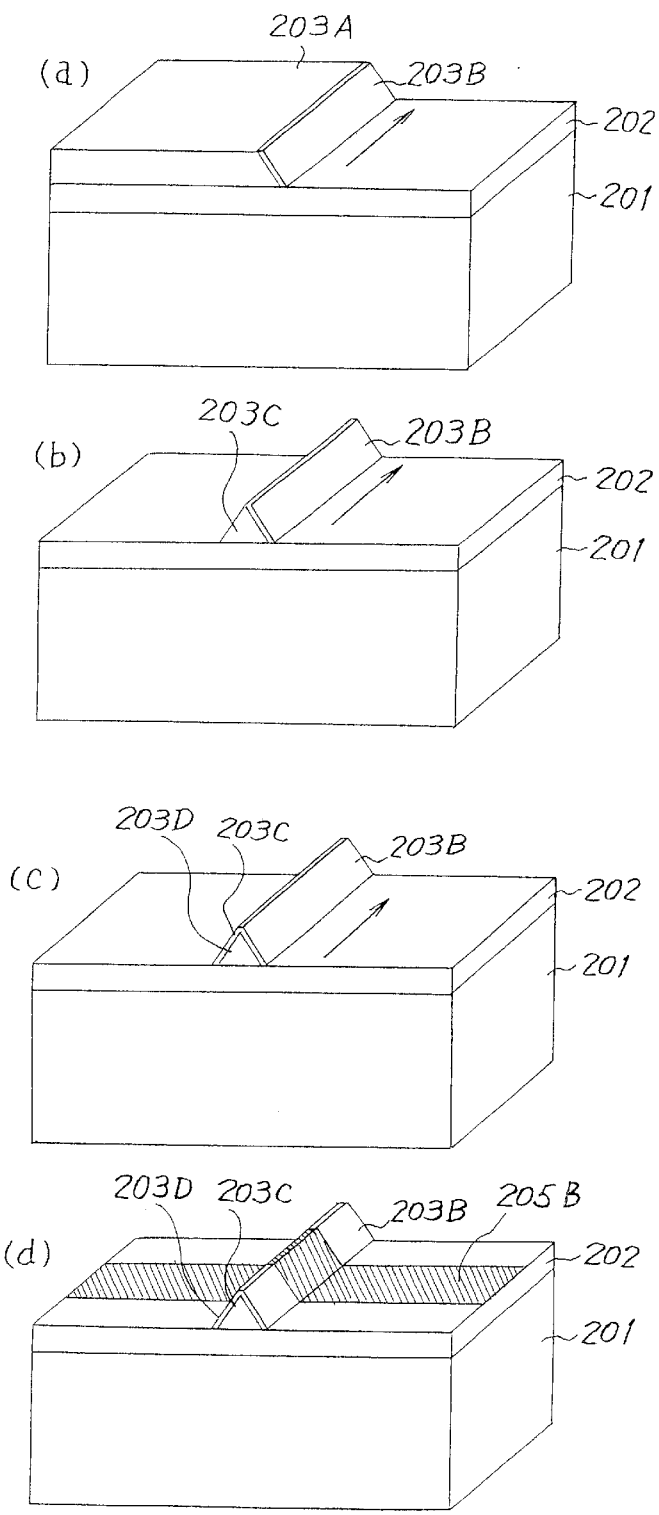
FIG. 45 includes views showing steps, subsequent to the steps shown in FIG. 44, of fabricating the parallel-spring-supported oscillator according to the twenty-first embodiment of the present invention.
Figure 46:
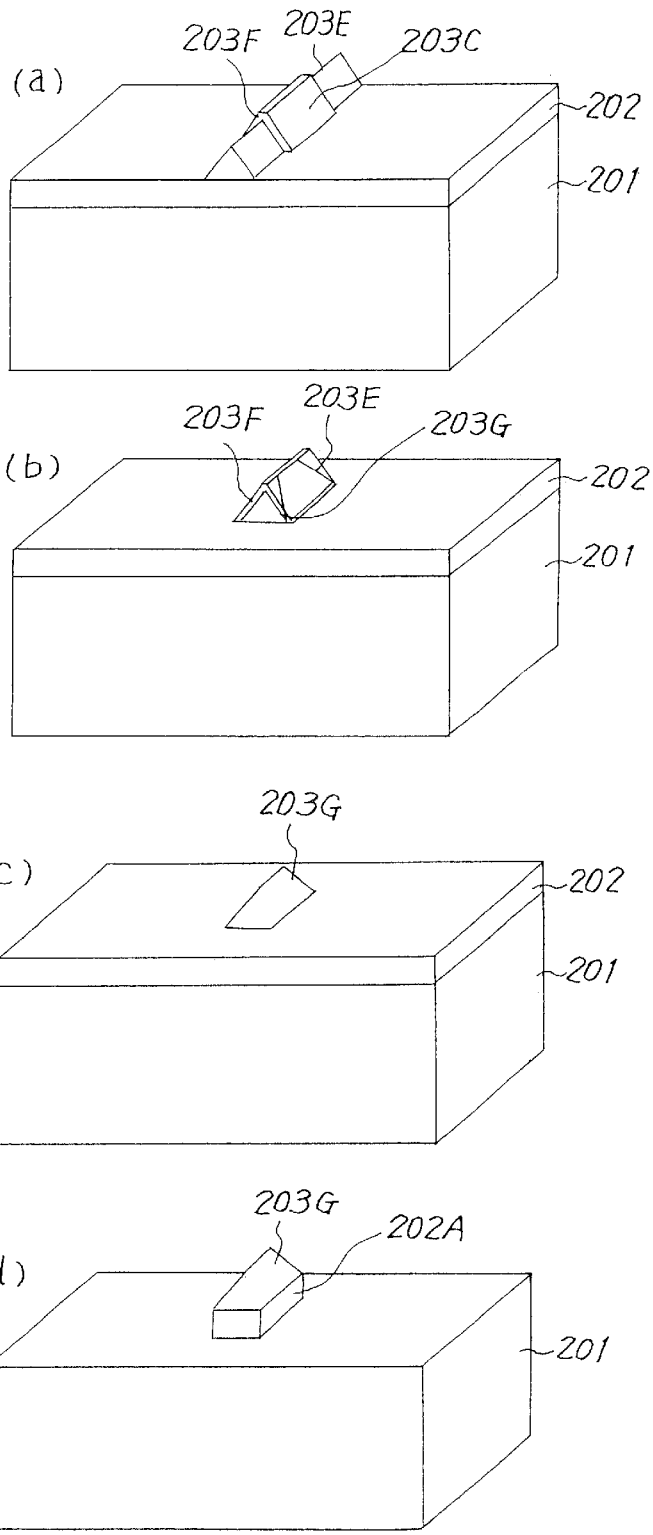
FIG. 46 includes views showing steps, subsequent to the steps shown in FIG. 45, of fabricating the parallel-spring-supported oscillator according to the twenty-first embodiment of the present invention.
Figure 47:
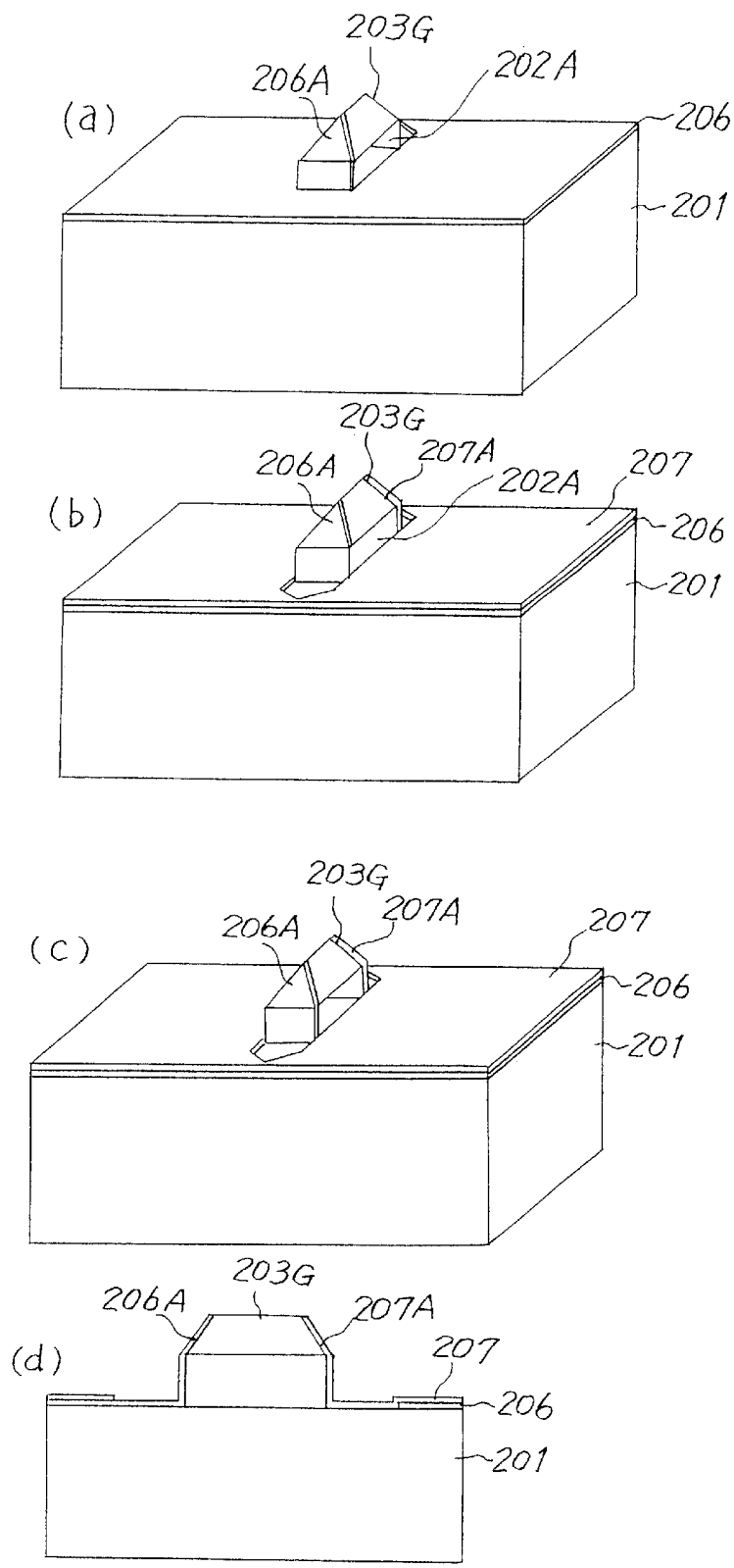
FIG. 47 includes views showing steps, subsequent to the steps shown in FIG. 46, of fabricating the parallel-spring-supported oscillator according to the twenty-first embodiment of the present invention.

FIG. 39 is a view showing a cantilever array according to a nineteenth embodiment of the present invention in which an oscillator having a triangular-pyramidal probe is provided at the tip end of a chip.

As shown in FIG. 39, through anisotropic etching of silicon by use of KOH, one oscillator 302 having a triangular-pyramidal probe can be disposed at the tip portion 301 of a millimetric chip which can be handled by use of, for example, tweezers. A large number of arrayed cantilevers 303 each having a triangular-pyramidal probe can be formed. Thus, one of the cantilevers 303 closest to the tip can be brought into contact with a sample.

FIGS. 40 to 43 are views showing steps of fabricating a nanometric mechanical oscillator according to a twentieth embodiment of the present invention.

(1) First, as shown in FIG. 40(a), an SOI (silicon on insulator) wafer consisting of an Si layer (thickness: 1 to 3 μm) 203, an SiO$_2$ layer 202, and an Si layer 201 is prepared. The Si layer 203 has a thickness of 1 to 3 μm, thereby determining the size of connected triangular pyramids each serving as a mass of a parallel-spring-supported oscillator.

(2) Subsequently, as shown in FIG. 40(b), an Si$_3$N$_4$ film thickness: 20 nm) 204 is deposited on the Si layer 203 through LPCVD.

(3) Subsequently, as shown in FIG. 40(c), a rectangular resist is applied along the (100) direction, and the Si$_3$N$_4$ film 204 is etched by means of RIE (reactive ion etching), so that an Si$_3$N$_4$ film 204A remains.

(4) Subsequently, as shown in FIG. 40(d), while the Si$_3$N$_4$ film 204A is used as a mask, the upper Si layer 203 is etched by use of KOH or RIE. At this time, the etching is caused to proceed in the (010) direction, while the etching time is carefully controlled. The width of the residual Si layer 203B determines the width of the connected triangular pyramids each serving as a mass of a parallel-spring-supported oscillator. If the width of the residual Si layer 203B is not sufficiently narrow, the connected triangular pyramids each serving as a mass are divided, and a parallel-spring-supported oscillator cannot be obtained at the final step. Therefore, the width of the residual Si layer 203 must be controlled carefully.

(5) Subsequently, as shown in FIG. 41(a), Si thermal oxidation is performed by means of Si local oxidation (LOCOS).

(6) Subsequently, as shown in FIG. 41(b), a rectangular resist is applied along the (010) direction, and the Si$_3$N$_4$ film 204A (FIG. 41(a)) is etched by means of RIE, so that an Si$_3$N$_4$ film 204B remains.

(7) Subsequently, as shown in FIG. 41(c), while the Si$_3$N$_4$ film 204B and the Si oxide film formed in the step of FIG. 41(a) are used as a mask, the upper Si layer 203 is etched anisotropically by use of KOH. Since the {111} planes are not etched during the Si etching by use of KOH, {111} planes passing through the four corners of the Si$_3$N$_4$ film 204B film are exposed, and the lower SiO$_2$ layer 202 emerges.

(8) Subsequently, as shown in FIG. 41(d), Si thermal oxidation is performed by means of Si local oxidation (LOCOS).

(9) Subsequently, as shown in FIG. 42(a), the Si$_3$N$_4$ film 204B is removed by use of H$_3$PO$_4$ to thereby expose the top face of the Si layer 203E.

(10) Subsequently, as shown in FIG. 42(b), while the oxide film formed in the step of FIG. 41(a) and the oxide film formed in the step of FIG. 41(d) are used as a mask, the Si layer 203E is etched anisotropically by use of KOH. Thus, {111} planes starting from the four corners of the Si$_3$N$_4$ film 204B film are formed. These planes are oriented to intersect the {111} planes formed in the step of FIG. 41(c) at an angle of 90°. The lower SiO$_2$ layer 202 emerges. Thus, the connected triangular pyramids 203F each serving as a mass of a parallel-spring-supported oscillator are formed.

(11) Subsequently, as shown in FIG. 42(c), the oxide films (LOCOS) which were formed in the steps of FIGS. 41(a) and 41(d), respectively, and served as a mask for KOH anisotropic etching in the steps of FIGS. 41(c) and 42(b) are removed.

(12) Subsequently, as shown in FIG. 42(d), while the connected triangular pyramids 203F are used as a mask, the SiO$_2$ layer 202 is etched by RIE (CHF$_3$ gas). The intermediate oxide film 202 is etched to form SiO$_2$ columns 202A each having a cross section equal to the shape of the top surface of the connected triangular pyramids 203F.

(13) Subsequently, as shown in FIG. 43(a), a Cr film 205 of a material, such as polysilicon, which has good mechanical properties as a spring and can endure BHF etching is obliquely deposited, through sputtering or vacuum vapor deposition, on the connected triangular pyramids 203F and the SiO$_2$ columns 202A in a direction parallel to the (010) direction. Only portions 205A of the film 205 are deposited on the connected triangular pyramids 203F and the SiO$_2$ columns 202A, and each is to serve as one spring of the corresponding parallel-spring-supported oscillator.

(14) Subsequently, as shown in FIG. 43(b), the same material is obliquely deposited on the connected triangular pyramids 203F and the SiO$_2$ columns 202A in a direction parallel to the (010) direction, such that a film 206 having the same thickness as that of the film 205 is formed on the surfaces of the connected triangular pyramids 203F and the SiO$_2$ columns 202A opposite the surfaces on which the film 205 was formed in the step of FIG. 43(a). Only portions 206A of the film 206 are deposited on the connected triangular pyramids 203F and the SiO$_2$ columns 202A and each is to serve as the other spring of the corresponding parallel-spring-supported oscillator.

(15) Finally, as shown in FIG. 43(c), the SiO$_2$ columns 202A are removed by BHF. Thus are completed parallel-spring-supported oscillators each including the connected triangular pyramids 203F serving as a mass and springs formed of the films 205A and 206A deposited in the steps of FIGS. 43(a) and 43(b).

FIGS. 44 to 47 are views showing steps of fabricating a nanometric mechanical oscillator according to a twenty-first embodiment of the present invention.

(1) First, as shown in FIG. 44(a), an SOI (silicon on insulator) wafer consisting of an Si layer (thickness: 1 to 3 μm) 203, an SiO$_2$ layer 202, and an Si layer 201 is prepared. The Si layer 203 has a thickness of 1 to 3 μm, thereby determining the size of connected triangular pyramids each serving as a mass of a parallel-spring-supported oscillator. Subsequently, an Si$_3$N$_4$ film (thickness: 20 nm) 204 is deposited on the Si layer 203 through LPCVD.

(2) Subsequently, as shown in FIG. 44(b), a rectangular resist is applied along the (100) direction, and the Si$_3$N$_4$ film 204 is etched by means of RIE, so that an Si$_3$N$_4$ film 204A remains.

(3) Subsequently, as shown in FIG. 44(c), while the Si$_3$N$_4$ film 204A is used as a mask, the upper Si layer 203 is etched by use of KOH. Since the {111} planes are not etched during the Si etching by use of KOH, an Si {111} plane is exposed to extend parallel to the Si$_3$N$_4$ film 204A. The lower SiO$_2$ layer 202 emerges.

(4) Subsequently, as shown in FIG. 44(d), Si thermal oxidation is performed by means of Si local oxidation (LOCOS). Only the surface layer of the Si {111} plane exposed in the step of FIG. 44(d) is oxidized, so that the surface layer becomes an SiO$_2$ film 203B.

(5) Subsequently, as shown in FIG. 45(a), the Si$_3$N$_4$ film 204A is removed by use of H$_3$PO$_4$ to thereby expose the top face of the Si layer 203A.

(6) Subsequently, as shown in FIG. 45(b), while the Si oxide film formed in the step of FIG. 44(d) is used as a mask, the Si layer 203A is etched anisotropically by use of KOH. Since {111} planes are not etched during the Si etching by use of KOH, an Si wire 203C having an Si {111} plane facing opposite to the Si {111} plane formed in the step of FIG. 44(c) is formed.

(7) Subsequently, as shown in FIG. 45(c), Si thermal oxidation is performed by means of Si local oxidation (LOCOS). Only the surface layer of the Si {111} plane exposed in the step of FIG. 45(b) is oxidized, so that the surface layer becomes an 502 film 203D.

(8) Subsequently, as shown in FIG. 45(d), resist 205B is applied along a direction perpendicular to the Si wire 203C formed in the step of FIG. 45(d). The width of the resist layer determines the length of a mass of the parallel-spring-supported oscillator.

(9) Subsequently, as shown in FIG. 46(a), while the resist 205B applied in the step of FIG. 45(d) is used as a mask, the oxide films 203B and 203D are patterned.

(10) Subsequently, as shown in FIG. 46(b), while the oxide films 203E and 203F are used as a mask, the Si wire 203 exposed in the step of FIG. 46(a) is etched by use of KOH. As a result, an Si {111} plane perpendicular to the Si wire 204C is exposed.

(11) Subsequently, as shown in FIG. 46(c), the oxide films formed in the steps of FIGS. 44(d) and 45(c) are removed.

(12) Subsequently, as shown in FIG. 46(d), while a three-dimensional projection surrounded by four Si {111} planes is used as a mask, the $SiO_2$ layer 202 is etched through RIE ($CHF_3$ gas). The intermediate oxide film 202 is etched to form an $SiO_2$ column 202A having a cross section equal to the shape of the top surface of a projection 204G.

(13) Subsequently, as shown in FIG. 47(a), a film 206 of, for example, polysilicon which has good mechanical properties as a spring and can endure BHF etching is obliquely deposited, through sputtering or vacuum vapor deposition, on the Si three-dimensional projection 203G and the $SiO_2$ column 202A in a direction parallel to the (110) direction. Only a portion 206A of the film 206 is deposited on the Si three-dimensional projection 203G and the $SiO_2$ column 202A, and is to serve as one spring of the parallel-spring-supported oscillator.

(14) Subsequently, as shown in FIG. 47(b), the same material is obliquely deposited on the Si three-dimensional projection 203G and the $SiO_2$ column 202A in a direction parallel to the (110) direction, such that a film 207 having the same thickness as that of the film 206 is formed on the surface of the Si three-dimensional projection 203G and the $SiO_2$ column 202A opposite the surface on which the film 206 was formed in the step of FIG. 47(a). Only a portion 207A of the film 207 is deposited on the Si three-dimensional projection 203G and the $SiO_2$ column 202A and is to serve as the other spring of the parallel-spring-supported oscillator.

(15) Finally, as shown in FIGS. 47(c) and 47(d), the $SiO_2$ column 202A is removed by BHF. Thus is completed a parallel-spring-supported oscillator which includes the Si three-dimensional projection 203G serving as a mass and springs formed of the films 206A and 207A deposited in the steps of FIGS. 47(a) and 47(b).

(16) Notably, the upper portion of the Si three-dimensional projection 203G shown in FIGS. 47(c) and 47(d) and serving as a mass of a parallel-spring-supported oscillator may be formed to assume the shape of a truncated rectangular pyramid.

As shown in the above-described twentieth and twenty-first embodiments, oblique vapor deposition is performed from opposite sides to form a parallel spring consisting of two plate springs, which support a probe mass or a mass having a flat plane.

Through employment of the above-described configuration, it becomes possible to realize a support mechanism for a probe or three-dimensional body which enables generation of accurate translational displacement. Further, when a structure including parallel springs perpendicularly intersecting each other is fabricated by use of a multilayer substrate, not only a translational displacement mechanism having a single degree of freedom but also a translational displacement mechanism having a plurality of degrees of freedom can be realized. This enables super-accurate positioning or an experiment for measuring physical properties while restricting movement or degrees of freedom, within a range from a nanometer region to a micrometer region. As described above, the present invention can greatly improve the resolution of a scanning force microscope in detecting variations in force or mass. That is, a probe having a stable nanometric mechanical oscillator can be fabricated.

Moreover, it is possible to evaluate the static and dynamic characteristics of an obtained mechanical oscillator to thereby obtain the resolution in detecting force or mass.

Further, a scanning force microscope which uses, as a probe, an oscillator fabricated in the above-described manner can be realized. In this case, a single atom or a cluster of atoms are scanned, and a resultant variation in the characteristic frequency of the oscillator-type probe can be detected. The possibility of atom identification can be investigated. In addition, performance as an ordinary scanning force microscope can be evaluated.

The present invention is not limited to the embodiments described above. Numerous modifications and variations of the present invention are possible in light of the spirit of the present invention, and they are not excluded from the scope of the present invention.

As have been described in detail above, the present invention achieves the following effects.

(1) It becomes possible to provide a stable and highly sensitive nanometric mechanical oscillator having a considerably high detection resolution that enables detection of variation in force or mass on the nanometer order, as well as a method of fabricating the same, and a measurement apparatus using the same.

(2) It becomes possible to evaluate the static and dynamic characteristics of an obtained mechanical oscillator to thereby obtain the resolution in detecting force or mass.

(3) It becomes possible to realize a scanning force microscope which uses, as a probe, an oscillator fabricated in the above-described manner, in order to scan a single atom or a cluster of atoms and detect a resultant variation in the characteristic frequency of the oscillator-type probe.

(4) By virtue of very high force detection sensitivity obtained by use of a nanometric oscillator, surface scanning or substance manipulation can be effected, while a very thin tube or whisker crystal, such as a nano carbon tube or whisker crystal, is used as a probe, without breaking the thin probe.

(5) Even when the oscillator is not used as an oscillation element, measurement of particles is possible. Since the oscillator has a very small mass, when a particle collides with the mass, the mass causes a large displacement, which can be detected.

(6) Incorporating a drive element or displacement detection element into each of a large number of arrayed mechanical oscillators is not easy. Even though such mechanical oscillators can be fabricated, processing a large number of signals output from the large number of cantilevers at high speed is difficult.

In the present invention, a large number of arrayed cantilevers are excited to oscillate by means of surface acoustic waves, which are caused to propagate along the surface with which the cantilevers come into contact in a stationary condition or to propagate to the base portions of the cantilevers, whereby the probes fixed to the surfaces of the cantilevers facing a sample are caused to approach the sample. A position at which each probe come into contact with the sample is measured on the basis of an average brightness obtained from the interference cavity formed between the back surface of the cantilever and the lower surface of the first layer. Thus, it becomes possible to cause a large number of cantilevers to sequentially oscillate by means of a surface-acoustic-wave generation unit fabricated at the end of the cantilever array or on the rear side of a shaft and to measure the positions at which the large number of cantilevers come into contact with the sample as brightness of laser interference cavities of the respective cantilevers. The system is configured in such a manner that brightness of each laser interference cavity reflects on brightness of the corresponding pixel of the video monitor or in such a manner that a sample is scanned along a sample plane relative to the cantilever array, so that each interference cavity imparts brightness to several pixels. Notably, continuous waves or burst waves are used as surface acoustic waves. Through synchronization of burst waves, it becomes possible to excite oscillation while preferentially selecting one of various oscillation modes of cantilevers. Further, through utilization of a phenomenon that a sample behaves differently depending on the oscillation frequency of the probe, the distribution of material properties inside the sample can be visualized. Notably, the present invention can be applied not only to measurement of samples but also to processing of the samples.

(7) It becomes possible to generate surface acoustic waves or Lamb waves in the base to which nanometric mechanical oscillators are fixed, in order to cause the mechanical oscillators to sequentially approach a sample, to thereby measure or process the sample.

(8) Since magnetic powder magnetized along a specific direction or in a specific pattern is incorporated into the cantilever, it is possible to preferentially induce higher-order oscillations in the cantilever by means of an external alternating magnetic field.

(9) Since whisker crystals arranged along a specific direction or in a specific pattern are incorporated into the cantilever, it becomes possible to impart to the cantilever anisotropy in mechanical properties and electrical properties, which anisotropy cannot be obtained in a cantilever formed of a single material only.

(10) When a sample is observed under a scanning force microscope by use of a cantilever of fixed length, the distribution of material properties of a sample can be investigated on the basis of the manner of generation of higher order modes of oscillation of the cantilever. However, since the length of the cantilever is fixed, measurement can be performed at discrete frequencies only. In the present invention, since a cantilever having a variable length is realized, the oscillation frequency of the cantilever can be swept continuously or swept within a wide frequency range. As a result, more accurate measurement of sample characteristics becomes possible; and a narrow distribution of material properties within a sample, which has been impossible to observe, can be visualized.

(11) Presently, an oscillation element such as a piezo element is attached to the base portion of a cantilever in order to induce higher-order mode oscillation of the cantilever. In the present invention, a surface-acoustic-wave generation element which can easily induce high-frequency oscillation is fabricated at the base portion of a cantilever; and surface acoustic waves are caused to propagate into the cantilever to thereby oscillate a probe at a predetermined frequency. Thus, it becomes possible to detect characteristics of a sample which vary with frequency.

(12) When the length of the cantilever is variable, the fundamental oscillation frequency and the higher order mode can be swept. Therefore, through fabrication of a surface-acoustic-wave generation element in the vicinity of the base end of such a cantilever, it becomes possible to sweep the fundamental oscillation frequency and the higher order mode within a wide frequency band.

(13) A probe assuming the form of a triangular pyramid is formed on an insulating film on a semiconductor substrate in such a manner that the probe projects outward in an overhung condition. Due to crystallinity of monocrystalline silicon, an nanometric oscillator can be fabricated accurately to have desired shape and dimensions. In this case, since the cantilever is parallel to the substrate, excitation and detection of optical oscillation and good coupling of surface acoustic waves or other waves are expected to be effected.

(14) Two triangular-pyramidal probes are formed on a semiconductor substrate in such a manner that the probes project inward in an overhung condition and are connected to each other. Alternatively, a projecting prove assuming the shape of a triangular prism or a parallel-spring-supported portion having a mass assuming the shape of a truncated rectangular pyramid is provided on the semiconductor substrate. Therefore, accurate translational displacement can be effected.

INDUSTRIAL APPLICABILITY

The present invention is suitable for application to a stable scanning force microscope of high sensitivity and is expected to be applied to mass spectrometers.

What is claimed is:

1. A nanometric mechanical oscillator comprising:
    (a) a base;
    (b) a rectangular oscillator mass; and
    (c) an elastic neck portion for connecting the base and the rectangular oscillator mass, the neck portion having a rectangular cross section when cut along a plane perpendicularly intersecting a main axis thereof.

2. A method of fabricating a nanometric mechanical oscillator, comprising:
    (a) preparing a substrate composed of a silicon substrate, a first silicon oxide film, a silicon film, and a second silicon oxide film;
    (b) forming a metal film on the second silicon oxide film;
    (c) forming a rectangular mask on the metal film;
    (d) etching the metal film by use of a solution and the mask; and
    (e) etching vertically and successively the second silicon oxide film, the silicon film, the first silicon oxide film, and the silicon substrate through reactive ion etching, whereby
        (g) a neck portion having a rectangular cross section when cut along a plane perpendicularly intersecting a main axis thereof is formed through the etching of the first silicon oxide film.

3. A measurement apparatus comprising:
    (a) a nanometric mechanical oscillator including a base, an oscillator mass, and an elastic neck portion for connecting the base and the oscillator mass;
    (b) a thin-film-shaped sample formed on the oscillator mass; and (c) a stationary probe for observing the thin-film-shaped sample.

4. A nanometric mechanical oscillator comprising:
(a) a base;
(b) a tetrahedral oscillator mass; and
(c) an elastic neck portion for connecting the base and the tetrahedral oscillator mass.

5. A method of fabricating a nanometric mechanical oscillator, comprising:
(a) preparing a substrate composed of a silicon substrate, a silicon oxide film, and a silicon film;
(b) forming a tetrahedral oscillator mass on the silicon oxide film through anisotropic etching of the silicon film;
(c) etching vertically the silicon oxide film through reactive ion etching, while using the tetrahedral oscillator mass as a mask, whereby
(d) a neck portion having elasticity is formed through the etching of the silicon oxide film.

6. A measurement apparatus comprising:
(a) a nanometric mechanical oscillator including a base, a tetrahedral oscillator mass, and an elastic neck portion for connecting the base and the tetrahedral oscillator mass, wherein
(b) the tetrahedral oscillator mass is oscillated vertically relative to a surface of a sample so as to observe the surface state of the sample.

7. A measurement apparatus comprising:
(a) a nanometric mechanical oscillator including a base, a tetrahedral oscillator mass, and an elastic neck portion for connecting the base and the tetrahedral oscillator mass, wherein
(b) the tetrahedral oscillator mass is oscillated horizontally relative to a surface of a sample so as to observe the surface state of the sample.

8. A measurement apparatus comprising:
(a) a nanometric mechanical oscillator including a base, a tetrahedral oscillator mass, and an elastic neck portion for connecting the base and the tetrahedral oscillator mass, wherein
(b) the tetrahedral oscillator mass is disposed vertically in the vicinity of a surface of a right-angle prism; the surface totally reflects a laser beam entering the prism to thereby generate a photo nearfield in the vicinity of the surface; the nearfield is disturbed by oscillation of the oscillator; and generated propagating light is collected by a light receiving element in order to detect the amplitude and frequency of the oscillation of the oscillator.

9. A measurement apparatus comprising:
(a) a nanometric mechanical oscillator including a base, an oscillator mass, and an elastic neck portion for connecting the base and the oscillator mass, wherein
(b) a probe formed of a nano tube or whisker is fixed to the oscillator mass; and interaction between the probe and the sample is detected to thereby obtain an image.

10. A measurement apparatus comprising:
(a) a nanometric mechanical oscillator including a plurality of oscillator masses disposed on a base, and elastic neck portions for connecting the base and the respective oscillator masses, wherein
(b) a functional thin film is attached to each of the oscillator masses so as to detect a trace substance within a gas sample.

11. A measurement apparatus comprising:
(a) a nanometric mechanical oscillator having, on its base, an oscillator mass and an elastic neck portion for connecting the base and the oscillator mass, wherein
(b) a core of an optical fiber is fixed to the nanometric mechanical oscillator such that the oscillator faces a sample; and oscillation of the oscillator mass caused by the sample is detected optically.

12. A measurement apparatus comprising:
(a) a nanometric mechanical oscillator having, on its base, an oscillator mass and an elastic neck portion for connecting the base and the oscillator mass, wherein
(b) under vacuum, an electron beam from an electrode is radiated onto the oscillator, while being focused to have a focal point on the nanometer order; the base of the oscillator has electrical conductivity, and a portion of the oscillator exhibits a piezo effect; the oscillator causes self-excited oscillation due to current that flows upon irradiation with the electron beam and displacement of the oscillator caused by the current; and variation in current flowing out of the oscillator is detected by a high-frequency current detector to thereby detect the amplitude and frequency of the oscillation of the oscillator.

13. A measurement apparatus comprising:
(a) a nanometric mechanical oscillator having, on its base, an oscillator mass and an elastic neck portion for connecting the base and the oscillator mass, wherein
(b) through use of a solid immersion lens, a spot of light focused to a degree beyond a bendable limit is formed in the vicinity of the base of the nanometric mechanical oscillator; and the amplitude and frequency of oscillation of the oscillator are detected on the basis of return light.

14. A measurement apparatus comprising:
(a) a nanometric mechanical oscillator having, on its base, an oscillator mass and an elastic neck portion for connecting the base and the oscillator mass, wherein
(b) the oscillator is fixedly disposed on a layered substrate having a mask layer of Sb; a laser beam is radiated onto the mask layer so as to change a portion of the mask to thereby establish a state equal to formation of a nanometric opening; and thus oscillation of the oscillator only is detected.

15. A measurement apparatus comprising:
(a) a nanometric mechanical oscillator including a piezo substrate, an oscillator mass, and an elastic neck portion for connecting the substrate and the tetrahedral oscillator mass, wherein
(b) comb-shaped electrodes are disposed on the piezo substrate; and AC voltage is applied to the electrodes to thereby generate surface acoustic waves, which excite the oscillator to oscillate.

16. A measurement apparatus comprising:
(a) a nanometric mechanical oscillator having, on its base, a plurality of oscillator masses and elastic neck portions for connecting the base and the respective oscillator masses, wherein
(b) displacement of the oscillator masses which is caused upon collision of a particle with the oscillator in accordance with the law of conservation of momentum is measured so as to detect a velocity of the particle.

17. A measurement apparatus comprising:
(a) a nanometric mechanical oscillator including a base, an oscillator mass, and an elastic neck portion formed of a silicon whisker and for connecting the base and the oscillator mass, wherein (b) the measurement apparatus measures acceleration or force.

18. A method of fabricating a nanometric mechanical oscillator, comprising:

(a) successively forming a silicon oxide film and a silicon film on a silicon substrate;

(b) anisotropically etching the silicon film to form a silicon tetrahedron;

(c) etching the silicon oxide film in a direction normal to the substrate while using the silicon tetrahedron as a mask to thereby form a silicon oxide column;

(d) vapor-depositing silicon or metal obliquely relative to the silicon substrate to thereby form a deposition film; and (e) removing the silicon oxide column to thereby form an elastic neck portion for supporting a tetrahedral probe, the neck portion being the deposition film assuming a plate-like shape and made of silicon or metal.

19. A method of fabricating a nanometric mechanical oscillator according to claim 18, wherein the neck portion is composed of two deposition films each assuming a plate-like shape and made of silicon or metal.

20. A nanometric mechanical oscillator including an element which comprises a first layer formed of a piezo substrate and having a surface-acoustic-wave generation unit; and a second layer having a large number of arrayed cantilevers each projecting from a base portion and having a probe, wherein the first and second layers are superposed on each other; and surface acoustic waves are generated within the piezo substrate along two directions in a plane, such that the respective probes sequentially approach a measurable region of a sample.

21. A measurement apparatus comprising:

(a) a large number of nanometric cantilevers arranged in a matrix on a substrate having an oscillating unit;

(b) a sample table on which a sample is placed to face the cantilevers;

(c) a lens system disposed on the back side of the cantilevers;

(d) an optical system for radiating light onto the lens system via a half mirror;

(e) an image capturing unit disposed at the back of the half mirror; and (f) a display unit connected to the image capturing unit, whereby (g) an image of the sample is displayed through action of the cantilevers.

22. A nanometric mechanical oscillator, wherein surface-acoustic-wave generation units are disposed along four sides of a piezo substrate; and a large number of cantilevers are arranged in a matrix at a center portion thereof.

23. A nanometric mechanical oscillator comprising: a nanometric cantilever disposed on a substrate having an actuator; and means for changing the length of the cantilever.

24. A nanometric mechanical oscillator according to claim 23, wherein the actuator is a surface-acoustic-wave generation unit.

25. A nanometric mechanical oscillator comprising a cantilever which projects from a base, is mainly formed of a plastic containing magnetic powder, and is magnetized in a direction intersecting an axial direction of the cantilever.

26. A nanometric mechanical oscillator comprising a cantilever which projects from a base and is mainly formed of a plastic containing whisker crystals arranged along an axial direction of the cantilever.

27. A nanometric mechanical oscillator comprising: a cantilever which projects from a base; and a surface-acoustic-wave generation unit provided on the base in the vicinity of a root portion of the cantilever.

28. A nanometric mechanical oscillator according to claim 27, wherein the cantilever has a triangular-pyramidal probe that projects outward.

29. A nanometric mechanical oscillator according to claim 27, wherein a large number of triangular-pyramidal probes are formed at the tip of a semiconductor chip.

30. A nanometric mechanical oscillator comprising: a cantilever which projects from a base; a surface-acoustic-wave generation unit provided on the base in the vicinity of a root portion of the cantilever, and means for changing the length of the cantilever.

31. A nanometric mechanical oscillator comprising a triangular-pyramidal probe formed on an insulating film on a semiconductor substrate such that the probe projects outward in an overhung state.

32. A nanometric mechanical oscillator according to claim 31, wherein a single or a large number of triangular-pyramidal probes are formed at the tip of a semiconductor chip.

33. A nanometric mechanical oscillator comprising a parallel-spring supported portion including two triangular-pyramidal probes which are formed on a semiconductor substrate such that the probes project inward in an overhung state and are connected to each other.

34. A nanometric mechanical oscillator comprising a parallel-spring supported portion including a probe assuming the form of a triangular prism projecting from a semiconductor substrate.

35. A nanometric mechanical oscillator comprising a parallel-spring supported portion including a mass formed on a semiconductor substrate and assuming the shape of a truncated rectangular pyramid.

* * * * *

UNITED STATES PATENT AND TRADEMARK OFFICE
CERTIFICATE OF CORRECTION

PATENT NO. : 6,611,178 B1
DATED : August 26, 2003
INVENTOR(S) : Kawakatsu et al.

It is certified that error appears in the above-identified patent and that said Letters Patent is hereby corrected as shown below:

<u>Column 9,</u>
Line 43, before "which", first instance, insert -- 11A --.

<u>Column 20,</u>
Line 67, "502" should read -- $SiO_2$ --.

Signed and Sealed this

Twenty-fifth Day of May, 2004

JON W. DUDAS
*Acting Director of the United States Patent and Trademark Office*